(12) United States Patent
Zhao et al.

(10) Patent No.: US 12,447,500 B2
(45) Date of Patent: Oct. 21, 2025

(54) VERSATILE FLOW THROUGH STRATEGY FOR SELECTIVE SURFACE MODIFICATION

(71) Applicant: Illumina, Inc., San Diego, CA (US)

(72) Inventors: Yannan Zhao, Del Mar, CA (US); Florika Macazo, San Diego, CA (US); Rachel Goodridge, San Diego, CA (US); Emily Welch, San Diego, CA (US); Hassan Bohra, Singapore (SG); Sang Park, San Diego, CA (US); Lisa Savagian, San Diego, CA (US); Borhan Chueh, San Diego, CA (US); Thomas Brubaker, Escondido, CA (US); Shreshtha Mishra, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 0 days.

(21) Appl. No.: 18/543,320

(22) Filed: Dec. 18, 2023

(65) Prior Publication Data

US 2024/0207890 A1 Jun. 27, 2024

Related U.S. Application Data

(60) Provisional application No. 63/476,314, filed on Dec. 20, 2022.

(51) Int. Cl.
*B05D 1/38* (2006.01)
*B05D 7/22* (2006.01)
*B05D 7/24* (2006.01)

(52) U.S. Cl.
CPC ............ *B05D 1/38* (2013.01); *B05D 7/24* (2013.01); *B05D 7/22* (2013.01)

(58) Field of Classification Search
CPC ............ B01J 19/00; B01J 19/0046; B01J 2219/00608; B01J 2219/00621;
(Continued)

(56) References Cited

U.S. PATENT DOCUMENTS 10,605,770 B2 * 3/2020 Hinz ................. C12Q 1/6874
10,919,033 B2 * 2/2021 Ren .................. C09D 105/12
(Continued)

FOREIGN PATENT DOCUMENTS

WO 2006036307 A2 4/2006
WO WO-2020190454 A1 * 9/2020 ......... B01L 3/502761

OTHER PUBLICATIONS

Written Opinion of The International Searching Authority in PCT/US2023/084527, Jun. 27, 2024. (Year: 2024).*
(Continued)

*Primary Examiner* — William P Fletcher, III
(74) *Attorney, Agent, or Firm* — Sheppard, Mullin, Richter & Hampton LLP; Jaime D. Choi

(57) ABSTRACT

A method for modifying an interstitial surface separating recesses from one another can include flowing a first fluid over the interstitial surface and into the recesses, such that the interstitial surface is substantially coated with the first fluid and the recesses are substantially filled with the first fluid; and while the first fluid remains within the recesses, replacing the first fluid coating the interstitial surface with a second fluid comprising a reagent.

18 Claims, 17 Drawing Sheets

(58) Field of Classification Search
CPC .... B01J 2219/00637; B05D 1/38; B05D 7/22; B05D 7/24
See application file for complete search history.

(56) References Cited

U.S. PATENT DOCUMENTS

| | | | |
|---|---|---|---|
| 10,955,332 B2 * | 3/2021 | Tsay | G01N 15/1484 |
| 2018/0327832 A1 * | 11/2018 | Ramirez | C12Q 1/6874 |
| 2022/0187710 A1 * | 6/2022 | Brahma | G03F 7/0002 |

OTHER PUBLICATIONS

Kehagias et al., "Stamp replication for thermal and UV nanoimprint lithography using a UV-sensitive silsesquioxane resist," Microelectronic Engineering 86:776-778 (2009).

* cited by examiner

VERSATILE FLOW THROUGH STRATEGY FOR SELECTIVE SURFACE MODIFICATION

CROSS-REFERENCE TO RELATED APPLICATIONS

This application claims the benefit of U.S. Provisional Application No. 63/476,314, filed on Dec. 20, 2022 and entitled "Versatile Flow Through Strategy for Selective Surface Modification," the entire contents of which are incorporated by reference herein.

FIELD

This application relates to the modification of surfaces.

BACKGROUND

Fluidic channels (e.g., flow cells) are used in many technological applications. For example, certain molecular analyses, such as certain polynucleotide sequencing methods, utilize polynucleotides that are coupled within a flow cell. For example, oligonucleotide primers (e.g., single stranded DNA or ssDNA) can be grafted to a fluidic channel within a flow cell and used to amplify target polynucleotides for sequencing.

Flow cell surfaces can be coated with different materials to modify properties of different surfaces, for example, to modify the hydrophobicity or hydrophilicity of different surfaces. It may be desirable to only modify the properties of a portion of the surfaces without modifying the properties of the remainder of the surfaces of the flow cell. However, previously available methods and structures for the selective surface modification of a flow cell can result in variation and a lack of reproducibility. Additionally, homogeneity of the resulting surface can be difficult to control.

SUMMARY

A versatile flow through strategy for selective surface modification is provided herein.

Some examples provide a method for modifying an interstitial surface separating recesses from one another. The method includes flowing a first fluid over the interstitial surface and into the recesses, such that the interstitial surface is substantially coated with the first fluid and the recesses are substantially filled with the first fluid. The method includes, while the first fluid remains within the recesses, replacing the first fluid coating the interstitial surface with a second fluid including a reagent.

Some examples further include using the reagent to modify the interstitial surface.

In some examples, the first fluid remaining within the recesses substantially inhibits the reagent from modifying the recesses.

In some examples, the first fluid and the second fluid are substantially immiscible with each other. In some examples, the first fluid is polar and the second fluid is nonpolar. In some examples, the first fluid is aqueous and the second fluid is organic. In some examples, the first fluid is nonpolar and the second fluid is polar. In some examples, the first fluid is organic and the second fluid is aqueous.

In some examples, a contact angle of water with the interstitial surface is between about 70 degrees and about 110 degrees. In some examples, a contact angle of water with the interstitial surface is between about 80 degrees and about 100 degrees. In some examples, a contact angle of water with the interstitial surface is between about 85 degrees and about 95 degrees.

In some examples, the second fluid displaces the first fluid from the interstitial surface.

In some examples, a third fluid displaces the first fluid from the interstitial surface before the second fluid replaces the first fluid coating the interstitial surface. In some examples, the third fluid is substantially immiscible with the second fluid. In some examples, the third fluid is miscible with the first fluid. In some examples, the third fluid is polar. In some examples, the third fluid is aqueous. In some examples, the second fluid displaces the third fluid from the interstitial surface.

Some examples further include, while the first fluid remains within the recesses and after replacing the first fluid coating the interstitial surface with the second fluid, solidifying the first fluid. In some examples, the first fluid is solidified using a change in temperature. In some examples, the first fluid is solidified using a change in pH. In some examples, the first fluid is solidified using light, mechanical force, a reactive gas, an electrical field, a magnetic field, or a chemical. In some examples, the first fluid includes agarose, gelatin, one or more other polysaccharides, alginate, carboxycellulose, gellan gum, polyacrylic acid, poly (N-isopropyl acrylamide), sodium polyacrylate, or one or more polyamines, polysaccharides, or polypeptides, or one or more precursors to polyacrylates, polythiols, polysulfones, polyamines, polyamides, polysaccharides, polypeptides, or polyesters, or other low melting point polymer. Some examples further include, after solidifying the first fluid within the recesses: melting the solidified first fluid; and removing the melted first fluid from the recesses. In some examples, the second fluid includes a gas.

In some examples, the second fluid includes a silane. In some examples, the silane includes one or more of (3-aminopropyl)triethoxysilane (APTES), 3-cyanopropyltrimethoxysilane (CPTMS), 3-(trimethoxysilyl)propyl acrylate (TRI), 3-azidopropyltriethoxysilane (Azido C3), n-propyltrimethoxysilane (C3), methoxytrimethylsilane (MDS), n-octyltrimethoxysilane (C8), (tridecafluoro-1,1,2,2-tetrahydrooctyl)tri-methoxysilane (FOTMS), perfluoro(polypropyleneoxy)methoxypropyltri-methoxysilane (PPFTMS), or a mercapto-silane.

In some examples, the interstitial surface includes a patterned material disposed on a substrate. In some examples, the patterned material further forms sidewalls of the recesses. In some examples, the patterned material includes a photoresist. In some examples, the photoresist includes SU-8.

In some examples, the substrate includes a different material than the patterned material. In some examples, a material of the substrate includes a glass, a semiconductor, or a polymer. In some examples, a material of the substrate forms a bottom wall of the recesses. In some examples, electrodes respectively are disposed on the substrate within the recesses. In some examples, a cover is disposed over the interstitial surface and the recesses, forming a space between the cover and the interstitial surface.

In some examples, the method includes using laminar flow to flow the first and second fluids in the space between the cover and the interstitial surface.

In some examples, the recesses include microwells. In some examples, the method includes using capillary action to fill the microwells with the first fluid.

In some examples, the interstitial surface and the recesses are located within a flow cell.

In some examples, the first fluid and the second fluid both include liquids.

In some examples, one of the first fluid and the second fluid is a liquid, and the other of the first fluid and the second fluid is a gas.

Some examples herein provide a structure produced using operations including flowing a first fluid over an interstitial surface and into recesses, such that the interstitial surface is substantially coated with the first fluid and the recesses are substantially filled with the first fluid. The operations further may include, while the first fluid remains within the recesses, replacing the first fluid coating the interstitial surface with a second fluid including a reagent.

In some examples, the structure is further produced using operations including using the reagent to modify the interstitial surface.

In some examples, the first fluid remaining within the recesses substantially inhibits the reagent from modifying the recesses.

In some examples, the first fluid and the second fluid are substantially immiscible with each other. In some examples, the first fluid is polar and the second fluid is nonpolar. In some examples, the first fluid is aqueous and the second fluid is organic. In some examples, a contact angle of water with the interstitial surface is between about 60 degrees and about 120 degrees, between about 70 degrees and about 110 degrees, between about 80 degrees and about 100 degrees, or between about 85 degrees and about 95 degrees.

In some examples, the second fluid displaces the first fluid from the interstitial surface.

In some examples, a third fluid displaces the first fluid from the interstitial surface before the second fluid replaces the first fluid coating the interstitial surface.

In some examples, the structure is further produced using operations including, while the first fluid remains within the recesses and after replacing the first fluid coating the interstitial surface with the second fluid, solidifying the first fluid. In some examples, the first fluid is solidified using a change in temperature or pH. In some examples, the first fluid is solidified using light, mechanical force, a reactive gas, an electrical field, a magnetic field, or a chemical. In some examples, the first fluid includes agarose, gelatin, one or more other polysaccharides, alginate, carboxycellulose, gellan gum, polyacrylic acid, poly(N-isopropyl acrylamide), sodium polyacrylate, or one or more polyamines, polysaccharides, or polypeptides, or one or more precursors to polyacrylates, polythiols, polysulfones, polyamines, polyamides, polysaccharides, polypeptides, or polyesters, or other low melting point polymer. In some examples, the structure is further produced using operations including, after solidifying the first fluid within the recess: melting the solidified first fluid; and removing the melted first fluid from the recesses. In some examples, the second fluid includes a gas.

In some examples, the second fluid includes a silane. In some examples, the silane includes one or more of (3-aminopropyl)triethoxysilane (APTES), 3-cyanopropyltrimethoxysilane (CPTMS), 3-(trimethoxysilyl)propyl acrylate (TRI), 3-azidopropyltriethoxysilane (Azido C3), n-propyltrimethoxysilane (C3), methoxytrimethylsilane (MDS), n-octyltrimethoxysilane (C8), (tridecafluoro-1,1,2,2-tetrahydrooctyl)tri-methoxysilane (FOTMS), perfluoro(polypropyleneoxy)methoxypropyltri-methoxysilane (PPFTMS), or a mercapto-silane.

In some examples, a cover is disposed over the interstitial surface and the recesses, forming a space between the cover and the interstitial surface, the structure being further produced using operations including using laminar flow to flow the first and second fluids in the space between the cover and the interstitial surface.

In some examples, the recesses include microwells.

In some examples, the structure is further produced using operations including using capillary action to fill the microwells with the first fluid.

In some examples, the first fluid and the second fluid both include liquids.

In some examples, one of the first fluid and the second fluid is a liquid, and the other of the first fluid and the second fluid is a gas.

Some examples herein provide a method for modifying recesses that are separated from one another by an interstitial surface. The method may include flowing a first fluid including a reagent over the interstitial surface and into the recesses, such that the interstitial surface is substantially coated with the first fluid and the recesses are substantially filled with the first fluid. The method may include, while the first fluid remains within the recesses, replacing the first fluid coating the interstitial surface with a second fluid.

In some examples, the method further includes, while the first fluid remains within the recesses, using the reagent to modify the recesses. In some examples, the second fluid coating the interstitial surface substantially inhibits the reagent from modifying the interstitial surface.

In some examples, the method further includes, after modifying the recesses, removing the second fluid.

In some examples, the method further includes, after modifying the recesses, removing the first fluid.

In some examples, the method further includes, after removing the first fluid, flowing a third fluid over the interstitial surface and into the recesses.

In some examples, the first fluid and the second fluid are substantially immiscible with each other. In some examples, the first fluid is polar and the second fluid is nonpolar. In some examples, the first fluid is aqueous and the second fluid is organic. In some examples, the first fluid is nonpolar and the second fluid is polar. In some examples, the first fluid is organic and the second fluid is aqueous.

In some examples, a contact angle of water with the interstitial surface is between about 60 degrees and about 120 degrees, between about 70 degrees and about 110 degrees, between about 80 degrees and about 100 degrees, or between about 85 degrees and about 95 degrees.

In some examples, the interstitial surface includes a patterned material.

In some examples, the first fluid includes a silane.

In some examples, the silane includes one or more of (3-aminopropyl)triethoxysilane (APTES), 3-cyanopropyltrimethoxysilane (CPTMS), 3-(trimethoxysilyl)propyl acrylate (TRI), 3-azidopropyltriethoxysilane (Azido C3), n-propyltrimethoxysilane (C3), methoxytrimethylsilane (MDS), n-octyltrimethoxysilane (C8), (tridecafluoro-1,1,2,2-tetrahydrooctyl)tri-methoxysilane (FOTMS), perfluoro(polypropyleneoxy)methoxypropyltri-methoxysilane (PPFTMS), or a mercapto-silane.

In some examples, the reagent includes a hydrogel, a biomolecule, streptavidin, DNA, a reagent for cleavage, or a reagent for capture.

In some examples, the interstitial surface includes a patterned material disposed on a substrate. In some examples, the patterned material further forms sidewalls of the recesses.

In some examples, the patterned material includes a photoresist. In some examples, the photoresist includes SU-8.

In some examples, the substrate includes a different material than the patterned material. In some examples, the material of the substrate includes a glass, a semiconductor, or a polymer. In some examples, the material of the substrate forms a bottom wall of the recesses. In some examples, electrodes respectively are disposed on the substrate within the recesses.

In some examples, a cover is disposed over the interstitial surface and the recesses, forming a space between the cover and the interstitial surface. In some examples, the method includes using laminar flow to flow the first and second fluids in the space between the cover and the interstitial surface.

In some examples, the recesses include microwells. In some examples, the method includes using capillary action to fill the microwells with the first fluid.

In some examples, the interstitial surface and the recesses are located within a flow cell.

In some examples, the first fluid and the second fluid both include liquids.

In some examples, one of the first fluid and the second fluid is a liquid, and the other of the first fluid and the second fluid is a gas.

Some examples herein provide a structure formed using any of the present methods.

It is to be understood that any respective features/examples of each of the aspects of the disclosure as described herein can be implemented together in any appropriate combination, and that any features/examples from any one or more of these aspects can be implemented together with any of the features of the other aspect(s) as described herein in any appropriate combination to achieve the benefits as described herein.

DETAILED DESCRIPTION

Figure 1A:
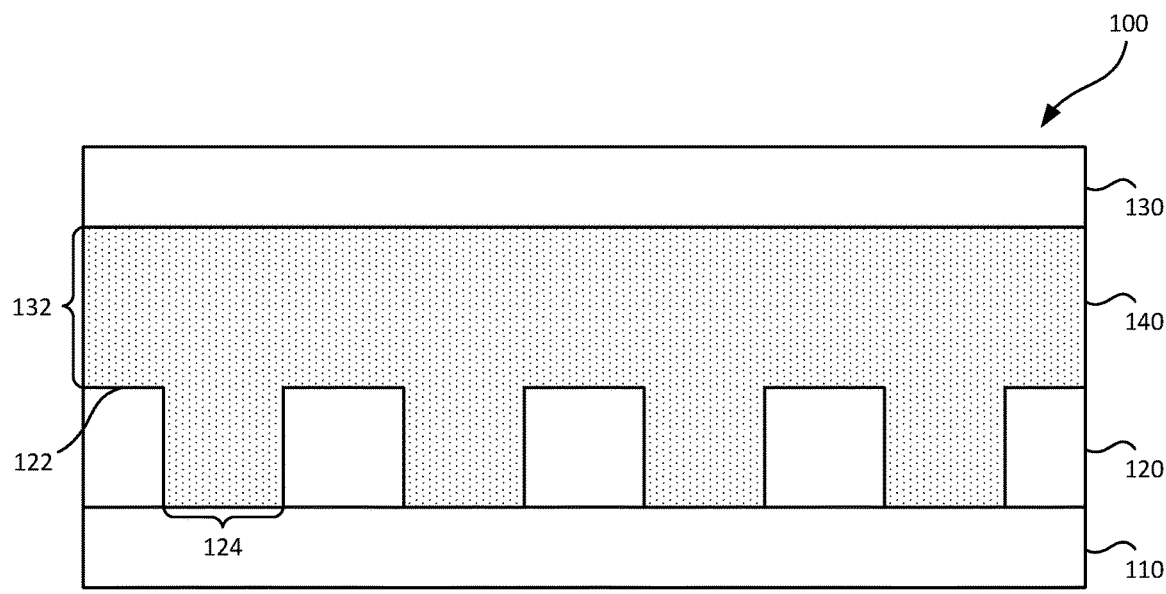
FIGS. 1A-1F illustrate example structures and operations for selectively modifying an interstitial surface, in accordance with various examples.
Figure 1B:
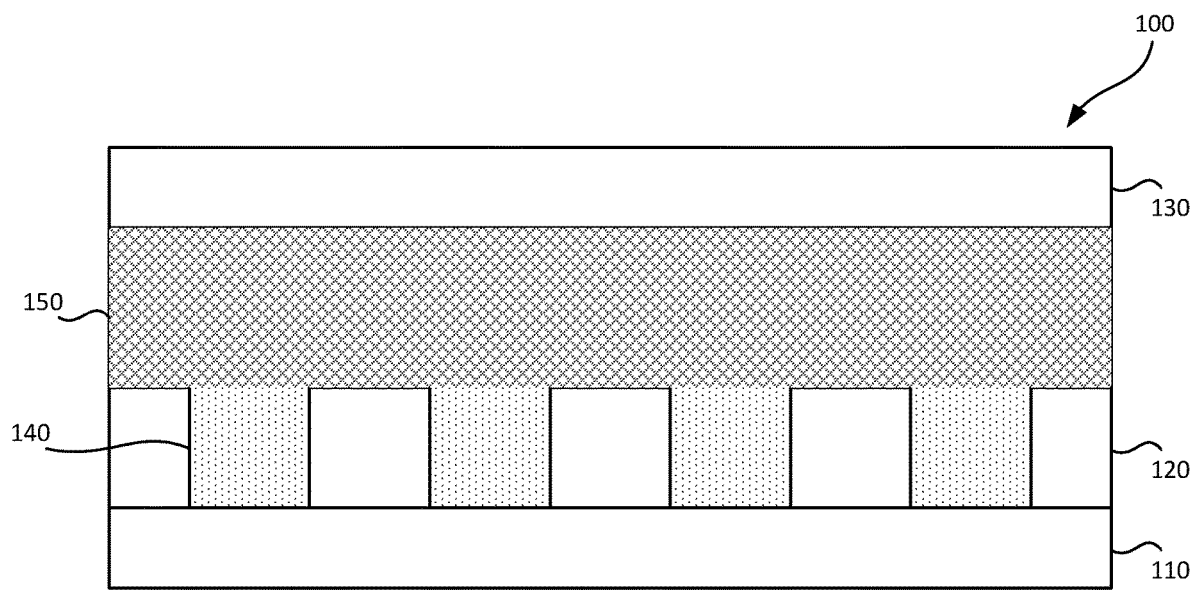
Figure 1C:
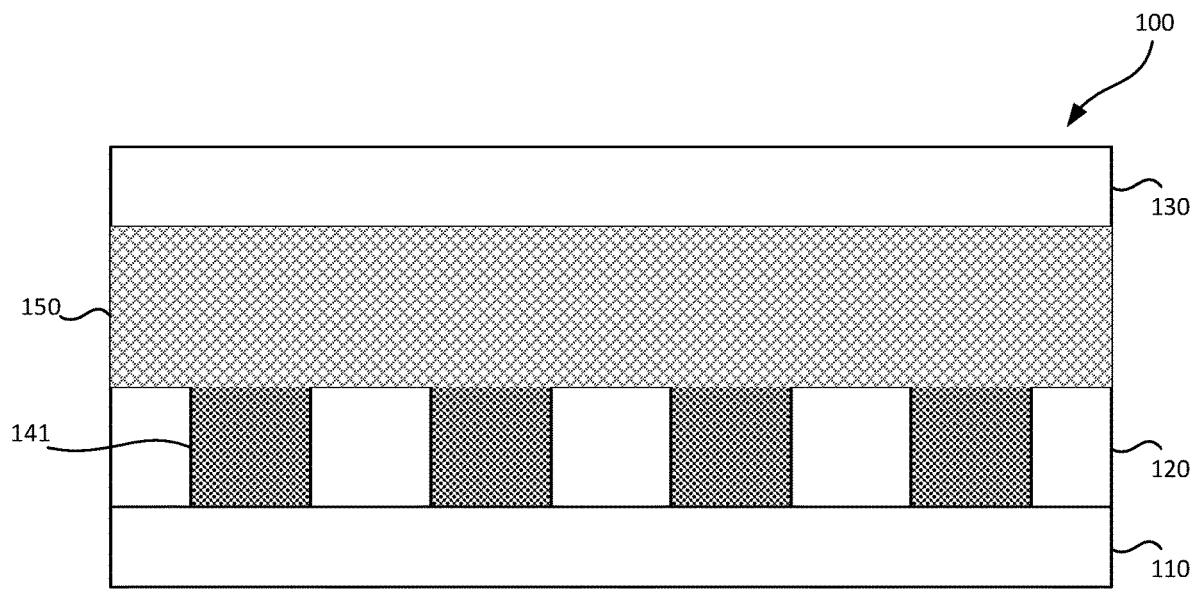
Figure 1D:
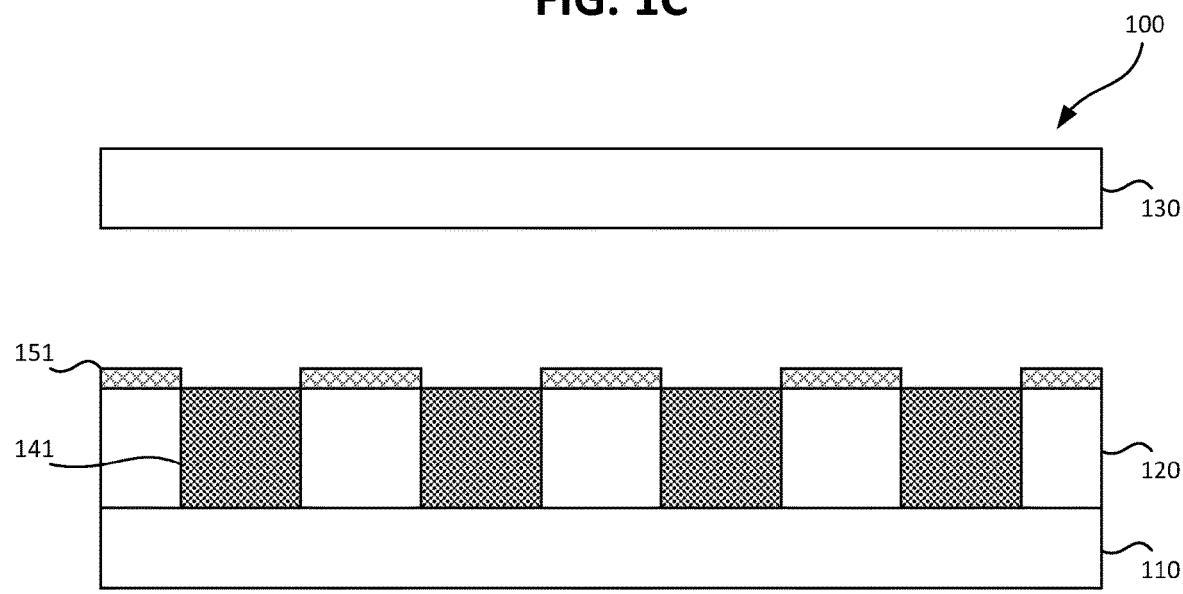
Figure 1E:
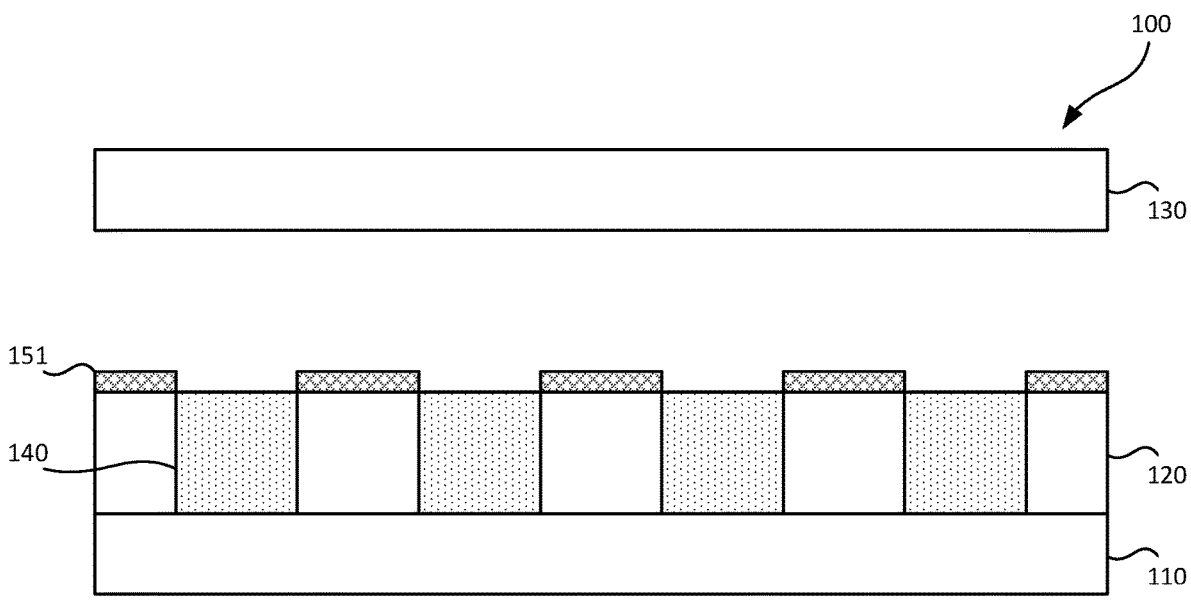
Figure 1F:
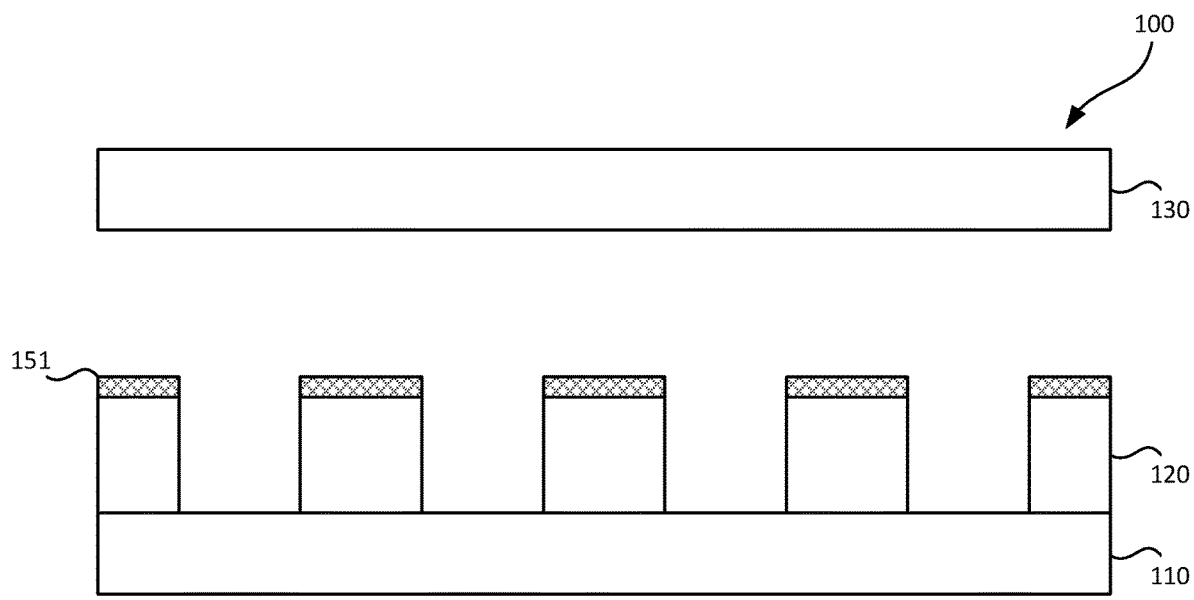

Disclosed herein are methods for selectively modifying surfaces and related structures. Given a structure including both recesses and an interstitial surface between the recesses, it may be desirable to selectively modify either the interstitial surface or the surfaces of the recesses. The selective modification may alter a property of either the interstitial surface or the surfaces of the recesses. For example, the selective modification of either the interstitial surface or the inner surfaces of the recesses may alter the hydrophobicity of the modified surface. This may be desirable in various applications, including in the manufacture of a flow cell. Illustratively, the hydrophobicity of the interstitial surface may be modified such that a membrane (e.g., a lipid bilayer membrane or amphiphilic block copolymer membrane) may be formed using such surface (illustratively, by painting), and may adhere or be adsorbed to the interstitial region.

Some previous methods for selectively modifying surfaces require a manual process, like wiping or polishing. Other previous methods require pre-treatment of the surface to be modified with a plasma, in a process called plasma ashing. Still other previous methods require the application of a patterned mask or photoresist coating to protect the surfaces that are not to be modified. Each of these previous methods has a disadvantage in reproducibility and consistency of the surface modification. For example, it is difficult to manually wipe or polish a surface selectively in order for the modification to take place. The manual wiping or polishing may not be consistent or even along the surface. Similar difficulties arise in applying a plasma, patterned mask, or photoresist coating. While the variation and lack of reproducibility of previous methods is not a factor for some applications, for others it is an important deficiency.

The methods and structures disclosed herein improve upon such previous methods because they do not involve manual wiping or polishing, plasma ashing, or the application of a patterned mask or photoresist. Instead, the disclosed methods utilize the flow of fluids across the interstitial surface and into the recesses. The disclosed methods take advantage of the immiscibility of different fluids to inhibit the fluid in contact with the interstitial surface from communicating with the fluid in contact with the recesses. As a result, the present methods have a higher consistency and reproducibility than previous methods such as described above. The selectivity of the disclosed methods is also higher than such previous methods, as will be made clear from the disclosure herein.

For example, as stated above, some previous methods for selectively modifying surfaces include pre-treatment of the surface with a plasma. When performed with an oxygen plasma, this pre-treatment serves to functionalize the surface with hydroxyl groups. The resulting hydroxyl groups can then be reacted with a silane. In these circumstances, the silane covers the underlying surface and forms a layer with a different property than the underlying surface, such as a difference in hydrophobicity. Because the silane was reacted with a hydroxyl group, the silane layer is attached to the surface via C—O—Si bonds. C—O—Si bonds can be problematic in certain environments because C—O—Si bonds are susceptible to hydrolysis. If the C—O—Si bonds are hydrolyzed, the silanes may be detached from the surface and the desired modified property may no longer be present.

In some examples, the methods and structures disclosed herein improve upon such previous methods because they do not involve the formation of C—O—Si bonds. Instead, certain methods disclosed herein utilize residual epoxide groups present on the surface of the substrate following fabrication. In some examples, a silane is employed as a bifunctional linker, for example where an amine group reacts with epoxides on the substrate surface. Silane condensation gives a new activated surface with abundant silanol groups. A standard surface silanization protocol can then be applied to the silane activated substrate surface to obtain a strong covalent siloxane (Si—O—Si) bond with the desired surface property. It should be appreciated that any other chemistries are compatible with the present methods and structures, for example surfaces that have amines or azides rather than oxides.

Examples provided herein are related to methods for selective surface modification and related structures. For example, provided herein are methods of selectively modifying an interstitial surface of a structure including a patterned material and a substrate that form interstitial surface and recesses. Also provided herein are methods of selectively modifying the interior walls of the recesses of a similar structure. Also provided herein are structures, and intermediate structures, that may be formed using the above methods.

Terms

Unless defined otherwise, all technical and scientific terms used herein have the same meaning as is commonly understood by one of ordinary skill in the art. The use of the term "including" as well as other forms, such as "include," "includes," and "included," is not limiting. The use of the term "having" as well as other forms, such as "have," "has," and "had," is not limiting. As used in this specification, whether in a transitional phrase or in the body of the claim, the terms "comprise(s)" and "comprising" are to be interpreted as having an open-ended meaning. That is, the above terms are to be interpreted synonymously with the phrases "having at least" or "including at least." For example, when used in the context of a process, the term "comprising" means that the process includes at least the recited steps, but can include additional steps. When used in the context of a compound, composition, or device, the term "comprising" means that the compound, composition, or device includes at least the recited features or components, but can also include additional features or components.

The terms "substantially", "approximately", and "about" used throughout this Specification are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

As used herein, terms such as "covalently coupled" or "covalently bonded" refer to the forming of a chemical bond that is characterized by the sharing of pairs of electrons between atoms. For example, a covalently coupled molecule refers to a molecule that forms chemical bonds with a substrate, as compared to coupling to the surface via other means, for example, a non-covalent bond such as electrostatic interaction.

The term "halogen" or "halo," as used herein, means fluorine, chlorine, bromine, or iodine, with fluorine and chlorine being examples.

As used herein, "alkyl" refers to a straight or branched hydrocarbon chain that is fully saturated (i.e., contains no double or triple bonds). The alkyl group may have 1 to 20 carbon atoms (whenever it appears herein, a numerical range such as "1 to 20" refers to each integer in the given range; e.g., "1 to 20 carbon atoms" means that the alkyl group may consist of 1 carbon atom, 2 carbon atoms, 3 carbon atoms, etc., up to and including 20 carbon atoms, although the present definition also covers the occurrence of the term "alkyl" where no numerical range is designated). The alkyl group may also be a medium size alkyl having 1 to 9 carbon atoms. The alkyl group could also be a lower alkyl having 1 to 4 carbon atoms. The alkyl group may be designated as "$C_{1-4}$ alkyl" or similar designations. By way of example only, "$C_{1-4}$ alkyl" or "$C_{1-4}$ alkyl" indicates that there are one to four carbon atoms in the alkyl chain, i.e., the alkyl chain is selected from the group consisting of methyl, ethyl, propyl, iso-propyl, n-butyl, iso-butyl, sec-butyl, and t-butyl. Typical alkyl groups include, but are in no way limited to, methyl, ethyl, propyl, isopropyl, butyl, isobutyl, tertiary butyl, pentyl, hexyl, and the like.

As used herein, "alkenyl" refers to a straight or branched hydrocarbon chain containing one or more double bonds. The alkenyl group may have 2 to 20 carbon atoms, although the present definition also covers the occurrence of the term "alkenyl" where no numerical range is designated. The alkenyl group may also be a medium size alkenyl having 2 to 9 carbon atoms. The alkenyl group could also be a lower alkenyl having 2 to 4 carbon atoms. The alkenyl group may be designated as "$C_{2-4}$ alkenyl" or similar designations. By way of example only, "$C_{2-4}$ alkenyl" indicates that there are two to four carbon atoms in the alkenyl chain, i.e., the alkenyl chain is selected from the group consisting of ethenyl, propen-1-yl, propen-2-yl, propen-3-yl, buten-1-yl, buten-2-yl, buten-3-yl, buten-4-yl, 1-methyl-propen-1-yl, 2-methyl-propen-1-yl, 1-ethyl-ethen-1-yl, 2-methyl-propen-3-yl, buta-1,3-dienyl, buta-1,2, -dienyl, and buta-1,2-dien-4-yl. Typical alkenyl groups include, but are in no way limited to, ethenyl, propenyl, butenyl, pentenyl, and hexenyl, and the like.

Groups that include an alkenyl group include optionally substituted alkenyl, cycloalkenyl, and heterocycloalkenyl groups.

As used herein, "alkynyl" refers to a straight or branched hydrocarbon chain containing one or more triple bonds. The alkynyl group may have 2 to 20 carbon atoms, although the present definition also covers the occurrence of the term "alkynyl" where no numerical range is designated. The alkynyl group may also be a medium size alkynyl having 2 to 9 carbon atoms. The alkynyl group could also be a lower alkynyl having 2 to 4 carbon atoms. The alkynyl group may be designated as "$C_{2-4}$ alkynyl" or similar designations. By way of example only, "$C_{2-4}$ alkynyl" or "$C_{2-4}$alkynyl" indicates that there are two to four carbon atoms in the alkynyl chain, i.e., the alkynyl chain is selected from the group consisting of ethynyl, propyn-1-yl, propyn-2-yl, butyn-1-yl, butyn-3-yl, butyn-4-yl, and 2-butynyl. Typical alkynyl groups include, but are in no way limited to, ethynyl, propynyl, butynyl, pentynyl, and hexynyl, and the like.

Groups that include an alkynyl group include optionally substituted alkynyl, cycloalkynyl, and heterocycloalkynyl groups.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 3 to 18 carbon atoms, although the present definition also covers the occurrence of the term "aryl" where no numerical range is designated. In some examples, the aryl group has 6 to 10 carbon atoms. The aryl group may be designated as "$C_{6-10}$ aryl," "$C_6$ or $C_{10}$ aryl," or similar designations. Examples of aryl groups include, but are not limited to, phenyl, naphthyl, azulenyl, and anthracenyl.

As used herein, "heterocycle" refers to a cyclic compound which includes atoms of carbon along with another atom (heteroatom), for example nitrogen, oxygen or sulfur. Heterocycles may be aromatic (heteroaryl) or aliphatic. An aliphatic heterocycle may be completely saturated or may contain one or more or two or more double bonds, for example the heterocycle may be a heterocycloalkyl. The heterocycle may include a single heterocyclic ring or multiple heterocyclic rings that are fused.

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen, oxygen and sulfur, in the ring backbone. When the heteroaryl is a ring system, every ring in the system is aromatic. The heteroaryl group may have 5-18 ring members (i.e., the number of atoms making up the ring backbone, including carbon atoms and heteroatoms), although the present definition also covers the occurrence of the term "heteroaryl" where no numerical range is designated. In some examples, the heteroaryl group has 5 to 10 ring members or 5 to 7 ring members. The heteroaryl group may be designated as "5-7 membered heteroaryl," "5-10 membered heteroaryl," or similar designations. Examples of heteroaryl rings include, but are not limited to, furyl, thienyl, phthalazinyl, pyrrolyl, oxazolyl, thiazolyl, imidazolyl, pyrazolyl, isoxazolyl, isothiazolyl, triazolyl, thiadiazolyl, pyridinyl, pyridazinyl, pyrimidinyl, pyrazinyl, triazinyl, quinolinyl, isoquinlinyl, benzimidazolyl, benzoxazolyl, benzothiazolyl, indolyl, isoindolyl, and benzothienyl.

As used herein, "cycloalkyl" means a fully saturated carbocyclyl ring or ring system. Examples include cyclopropyl, cyclobutyl, cyclopentyl, and cyclohexyl.

As used herein, "cycloalkenyl" or "cycloalkene" means a carbocyclyl ring or ring system having at least one double bond, wherein no ring in the ring system is aromatic. An example is cyclohexenyl or cyclohexene. Another example is norbornene or norbornenyl.

As used herein, "heterocycloalkenyl" or "heterocycloalkene" means a carbocyclyl ring or ring system with at least one heteroatom in ring backbone, having at least one double bond, wherein no ring in the ring system is aromatic. In some examples, heterocycloalkenyl or heterocycloalkene ring or ring system is 3-membered, 4-membered, 5-membered, 6-membered, 7-membered, 8-membered, 9-membered, or 10-membered.

As used herein, "cycloalkynyl" or "cycloalkyne" means a carbocyclyl ring or ring system having at least one triple bond, wherein no ring in the ring system is aromatic. An example is cyclooctyne. Another example is bicyclononyne. Another example is dibenzocyclooctyne (DBCO).

As used herein, "heterocycloalkynyl" or "heterocycloalkyne" means a carbocyclyl ring or ring system with at least one heteroatom in ring backbone, having at least one triple bond, wherein no ring in the ring system is aromatic. In some examples, heterocycloalkynyl or heterocycloalkyne ring or ring system is 3-membered, 4-membered, 5-membered, 6-membered, 7-membered, 8-membered, 9-membered, or 10-membered.

As used herein, "heterocycloalkyl" means a non-aromatic cyclic ring or ring system containing at least one heteroatom in the ring backbone. Heterocycloalkyls may be joined together in a fused, bridged or spiro-connected fashion. Heterocycloalkyls may have any degree of saturation provided that at least one heterocyclic ring in the ring system is not aromatic. The heterocycloalkyl group may have 3 to 20 ring members (i.e., the number of atoms making up the ring backbone, including carbon atoms and heteroatoms), although the present definition also covers the occurrence of the term "heterocycloalkyl" where no numerical range is designated. The heterocycloalkyl group may also be a medium size heterocycloalkyl having 3 to 10 ring members. The heterocycloalkyl group could also be a heterocycloalkyl having 3 to 6 ring members. The heterocycloalkyl group may be designated as "3-6 membered heterocycloalkyl" or similar designations. In some six membered monocyclic heterocycloalkyls, the heteroatom(s) are selected from one up to three of O, N or S, and in some five membered monocyclic heterocycloalkyls, the heteroatom(s) are selected from one or two heteroatoms selected from O, N, or S. Examples of heterocycloalkyl rings include, but are not limited to, azepinyl, acridinyl, carbazolyl, cinnolinyl, dioxolanyl, imidazolinyl, imidazolidinyl, morpholinyl, oxiranyl, oxepanyl, thiepanyl, piperidinyl, piperazinyl, dioxopiperazinyl, pyrrolidinyl, pyrrolidonyl, pyrrolidionyl, 4-piperidonyl, pyrazolinyl, pyrazolidinyl, 1,3-dioxinyl, 1,3-dioxanyl, 1,4-dioxinyl, 1,4-dioxanyl, 1,3-oxathianyl, 1,4-oxathiinyl, 1,4-oxathianyl, 2H-1,2-oxazinyl, trioxanyl, hexahydro-1,3,5-triazinyl, 1,3-dioxolyl, 1,3-dioxolanyl, 1,3-dithiolyl, 1,3-dithiolanyl, isoxazolinyl, isoxazolidinyl, oxazolinyl, oxazolidinyl, oxazolidinonyl, thiazolinyl, thiazolidinyl, 1,3-oxathiolanyl, indolinyl, isoindolinyl, tetrahydrofuranyl, tetrahydropyranyl, tetrahydrothiophenyl, tetrahydrothiopyranyl, tetrahydro-1,4-thiazinyl, thiamorpholinyl, dihydrobenzofuranyl, benzimidazolidinyl, and tetrahydroquinoline.

As used herein, the term "nucleotide" is intended to mean a molecule that includes a sugar and at least one phosphate group, and in some examples also includes a nucleobase. A nucleotide that lacks a nucleobase can be referred to as "abasic." Nucleotides include deoxyribonucleotides, modified deoxyribonucleotides, ribonucleotides, modified ribonucleotides, peptide nucleotides, modified peptide nucleotides, modified phosphate sugar backbone nucleotides, and mixtures thereof. Examples of nucleotides include adenosine monophosphate (AMP), adenosine diphosphate (ADP), adenosine triphosphate (ATP), thymidine monophosphate (TMP), thymidine diphosphate (TDP), thymidine triphosphate (TTP), cytidine monophosphate (CMP), cytidine diphosphate (CDP), cytidine triphosphate (CTP), guanosine monophosphate (GMP), guanosine diphosphate (GDP), guanosine triphosphate (GTP), uridine monophosphate (UMP), uridine diphosphate (UDP), uridine triphosphate (UTP), deoxyadenosine monophosphate (dAMP), deoxyadenosine diphosphate (dADP), deoxyadenosine triphosphate (dATP), deoxythymidine monophosphate (dTMP), deoxythymidine diphosphate (dTDP), deoxythymidine triphosphate (dTTP), deoxycytidine diphosphate (dCDP), deoxycytidine triphosphate (dCTP), deoxyguanosine monophosphate (dGMP), deoxyguanosine diphosphate (dGDP), deoxyguanosine triphosphate (dGTP), deoxyuridine monophosphate (dUMP), deoxyuridine diphosphate (dUDP), and deoxyuridine triphosphate (dUTP).

As used herein, the term "nucleotide" also is intended to encompass any nucleotide analogue which is a type of nucleotide that includes a modified nucleobase, sugar and/or phosphate moiety compared to naturally occurring nucleotides. Example modified nucleobases include inosine, xathanine, hypoxathanine, isocytosine, isoguanine, 2-aminopurine, 5-methylcytosine, 5-hydroxymethyl cytosine, 2-aminoadenine, 6-methyl adenine, 6-methyl guanine, 2-propyl guanine, 2-propyl adenine, 2-thiouracil, 2-thiothymine, 2-thiocytosine, 15-halouracil, 15-halocytosine, 5-propynyl uracil, 5-propynyl cytosine, 6-azo uracil, 6-azo cytosine, 6-azo thymine, 5-uracil, 4-thiouracil, 8-halo adenine or guanine, 8-amino adenine or guanine, 8-thiol adenine or guanine, 8-thioalkyl adenine or guanine, 8-hydroxyl adenine or guanine, 5-halo substituted uracil or cytosine, 7-methylguanine, 7-methyladenine, 8-azaguanine, 8-azaadenine, 7-deazaguanine, 7-deazaadenine, 3-deazaguanine, 3-deazaadenine or the like. As is known in the art, certain nucleotide analogues cannot become incorporated into a polynucleotide, for example, nucleotide analogues such as adenosine 5'-phosphosulfate. Nucleotides can include any suitable number of phosphates, e.g., three, four, five, six, or more than six phosphates.

As used herein, the term "polynucleotide" refers to a molecule that includes a sequence of nucleotides that are bonded to one another. A polynucleotide is one nonlimiting example of a polymer. Examples of polynucleotides include deoxyribonucleic acid (DNA), ribonucleic acid (RNA), locked nucleic acid (LNA), peptide nucleic acid (PNA), and analogues thereof. A polynucleotide can be a single stranded sequence of nucleotides, such as RNA or single stranded DNA, a double stranded sequence of nucleotides, such as double stranded DNA, DNA that is folded to form a hairpin that is partially single stranded and partially double stranded, double-stranded amalgamations in which there are molecules that are non-covalently coupled to one another (e.g., via reversible hydrogen binding), and/or can include a mixture of a single stranded and double stranded sequences of nucleotides. Double stranded DNA (dsDNA) includes genomic DNA, and PCR and amplification products. Single stranded DNA (ssDNA) can be converted to dsDNA and vice-versa. Polynucleotides can include non-naturally occurring DNA, such as enantiomeric DNA. The precise sequence of nucleotides in a polynucleotide can be known or unknown. The following are examples of polynucleotides: a gene or gene fragment (for example, a probe, primer, expressed sequence tag (EST) or serial analysis of gene expression (SAGE) tag), genomic DNA, genomic DNA fragment, exon, intron, messenger RNA (mRNA), transfer RNA, ribosomal RNA, ribozyme, cDNA, recombinant polynucleotide, synthetic polynucleotide, branched polynucleotide, plasmid, vector, isolated DNA of any sequence, isolated RNA of any sequence, nucleic acid probe, primer or amplified copy of any of the foregoing.

As used herein, the term "target polynucleotide" is intended to mean a polynucleotide that is the object of an analysis or action. The analysis or action includes subjecting the polynucleotide to amplification, sequencing, and/or other procedure. A target polynucleotide can include nucleotide sequences additional to a target sequence to be analyzed. For example, a target polynucleotide can include one or more adapters, including an adapter that functions as a primer binding site, that flank(s) a target polynucleotide sequence that is to be analyzed. A target polynucleotide hybridized to a capture primer can include nucleotides that extend beyond the 5' or 3' end of the capture oligonucleotide in such a way that not all of the target polynucleotide is amenable to extension. In particular examples, target polynucleotides can have different sequences than one another but can have first and second adapters that are the same as one another. The two adapters that can flank a particular target polynucleotide sequence can have the same sequence as one another, or complementary sequences to one another, or the two adapters can have different sequences. Thus, species in a plurality of target polynucleotides can include regions of known sequence that flank regions of unknown sequence that are to be evaluated by, for example, sequencing (e.g., SBS). In some examples, target polynucleotides carry an adapter at a single end, and such adapter can be located at either the 3' end or the 5' end the target polynucleotide. Target polynucleotides can be used without any adapter, in which case a primer binding sequence can come directly from a sequence found in the target polynucleotide.

The terms "polynucleotide" and "oligonucleotide" are used interchangeably herein. The different terms are not intended to denote any particular difference in size, sequence, or other property unless specifically indicated otherwise. For clarity of description the terms can be used to distinguish one species of polynucleotide from another when describing a particular method or composition that includes several polynucleotide species.

As used herein, a "polymerase" is intended to mean an enzyme having an active site that assembles polynucleotides by polymerizing nucleotides into polynucleotides. A polymerase can bind a primed single stranded target polynucleotide, and can sequentially add nucleotides to the growing primer to form a "complementary copy" polynucleotide having a sequence that is complementary to that of the target polynucleotide. Another polymerase, or the same polymerase, then can form a copy of the target nucleotide by forming a complementary copy of that complementary copy polynucleotide. DNA polymerases can bind to the target polynucleotide and then move down the target polynucleotide sequentially adding nucleotides to the free hydroxyl group at the 3' end of a growing polynucleotide strand (growing amplicon). DNA polymerases can synthesize complementary DNA molecules from DNA templates and RNA polymerases can synthesize RNA molecules from DNA templates (transcription). Polymerases can use a short RNA or DNA strand (primer), to begin strand growth. Some polymerases can displace the strand upstream of the site where they are adding bases to a chain. Such polymerases can be said to be strand displacing, meaning they have an activity that removes a complementary strand from a template strand being read by the polymerase. Example polymerases having strand displacing activity include, without limitation, the large fragment of Bst (*Bacillus stearothermophilus*) polymerase, exo-Klenow polymerase or sequencing grade T7 exo-polymerase. Some polymerases degrade the strand in front of them, effectively replacing it with the growing chain behind (5' exonuclease activity). Some polymerases have an activity that degrades the strand behind them (3' exonuclease activity). Some useful polymerases have been modified, either by mutation or otherwise, to reduce or eliminate 3' and/or 5' exonuclease activity.

As used herein, the term "primer" refers to a polynucleotide to which nucleotides can be added via a free 3' OH group. The primer length can be any suitable number of bases long and can include any suitable combination of natural and non-natural nucleotides. A target polynucleotide can include an "adapter" that hybridizes to (has a sequence that is complementary to) a primer, and can be amplified so as to generate a complementary copy polynucleotide by adding nucleotides to the free 3' OH group of the primer. A "capture primer" refers to a primer that is coupled to a substrate. In some examples, capture primers are P5 and P7 primers that are commercially available from Illumina, Inc. (San Diego, CA). In some examples, primers (such as primers or P5 or P7 primers) include a linker or spacer at the 5' end. Such linker or spacer can be included in order to permit chemical or enzymatic cleavage, or to confer some other desirable property, for example to enable covalent attachment to a substrate, or to act as spacers to position a site of cleavage an optimal distance from the solid support. In certain cases, 10 spacer nucleotides can be positioned between the point of attachment of the P5 or P7 primers to a polymer or a solid support. In some examples, polyT spacers are used, although other nucleotides and combinations thereof can also be used. In one example, the spacer is a 6T to 10T spacer. In some examples, the linkers include cleavable nucleotides including a chemically cleavable functional group such as a vicinal diol or allyl T.

As used herein, the term "amplicon," when used in reference to a polynucleotide, is intended to mean a product of copying the polynucleotide, wherein the product has a nucleotide sequence that is substantially the same as, or is substantially complementary to, at least a portion of the nucleotide sequence of the polynucleotide. "Amplification" and "amplifying" refer to the process of making an amplicon of a polynucleotide. A first amplicon of a target polynucleotide can be a complementary copy. Additional amplicons are copies that are created, after generation of the first amplicon, from the target polynucleotide or from the first amplicon. A subsequent amplicon can have a sequence that is substantially complementary to the target polynucleotide or is substantially identical to the target polynucleotide. It will be understood that a small number of mutations (e.g., due to amplification artifacts) of a polynucleotide can occur when generating an amplicon of that polynucleotide.

As used herein, the term "silane" refers to an organic or inorganic compound containing one or more silicon atoms. A non-limiting example of an inorganic silane compound is $SiH_4$, or halogenated $SiH_4$ where hydrogen is replaced by one or more halogen atoms. A non-limiting example of an organic silane compound is $X-R^C-Si(OR^D)_3$, wherein X is a non-hydrolyzable organic group, such as amino, vinyl, epoxy, methacrylate, sulfur, alkyl, alkenyl, or alkynyl; $R^C$ is a spacer, for example $-(CH_2)_n-$, wherein n is 0 to 1000; each $R^D$ is independently selected from hydrogen, optionally substituted alkyl, optionally substituted alkenyl, optionally substituted alkynyl, optionally substituted carbocyclyl, optionally substituted aryl, optionally substituted 5-10 membered heteroaryl, and optionally substituted 5-10 membered heterocyclyl, as defined herein. In some examples, one or more $R^D$ may be or include poly(ethylene) oxide or an ether group. In some examples, the silanes may be cross-linked such that the oxygen atom of an $-OR^D$ group of $X-R^C-Si(OR^D)_3$, is attached to the silicon atom of an adjacent organic silane compound, $X-R^C-Si(OR^D)_3$. Furthermore, the silane compounds may be attached to a substrate surface by covalent binding of the $X-R^C-Si(OR^D)_3$ moieties to oxygen atoms on the surface. Thus, in some examples, the silanes described include the following structure:

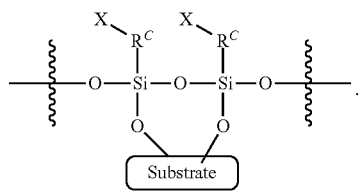

As used herein, the term "silane" can include mixtures of different silane compounds. In some examples, X is a norbornenyl group. In some examples, X is a bicyclononynyl group. In some examples, X is an alkene- or alkyne-containing group. In some examples, X is alkene or alkyne. In some examples, the $R^C$ linker is a $C_{2-6}$alkylene group.

As used herein, the term "substrate" refers to a material that includes a solid support. A substrate can include a polymer that defines the solid support, or that is disposed on the solid support. Example substrate materials can include glass, silica, plastic, quartz, metal, metal oxide, metalloid, carbon (e.g., glassy carbon, diamond, or other allotrope), organo-silicate (e.g., polyhedral organic silsesquioxanes (POSS)), polyacrylates, tantalum oxide, complementary metal oxide semiconductor (CMOS), or combinations thereof. An example of POSS can be that described in Kehagias et al., Microelectronic Engineering 86 (2009), pp. 776-778, which is incorporated by reference in its entirety. Illustratively, POSS-containing monomers can be polymerised reaching a gel-point rapidly to furnish a POSS resin (a polymer functionalized to include POSS) on which soft material functionalisation can be performed. In some examples, substrates used in the present application include silica-based substrates, such as glass, fused silica, or other silica-containing material. In some examples, substrates can include silicon, silicon nitride, or silicone hydride. In some examples, substrates used in the present application include plastic materials or components such as polyethylene, polystyrene, poly(vinyl chloride), polypropylene, nylons, latex, polyether ether ketone, polydimethylsiloxane, natural and synthetic rubbers, polybutadiene, polytetrafluoroethylene, polyesters, polycarbonates, polyurethane, and poly(methyl methacrylate). Example plastics materials include poly(methyl methacrylate), polystyrene, cyclic olefin copolymer, and cyclic olefin polymer substrates. In some examples, the substrate is or includes a silica-based material or plastic material or a combination thereof. In particular examples, the substrate has at least one surface comprising glass or a silicon-based polymer. In some examples, the substrates can include a metal. In some such examples, the metal is gold. In some examples, the substrate has at least one surface comprising a metal oxide. In one example, the surface comprises a tantalum oxide or tin oxide. Acrylamides, enones, or acrylates can also be utilized as a substrate material or component. Other substrate materials can include, but are not limited to gallium arsenide, indium phosphide, aluminum, ceramics, polyimide, quartz, resins, polymers and copolymers. In some examples, the substrate and/or the substrate surface can be, or include, quartz. In some other examples, the substrate and/or the substrate surface can be, or include, semiconductor, such as GaAs or ITO. The foregoing lists are intended to be illustrative of, but not limiting to the present application. Substrates can comprise a single material or a plurality of different materials. Substrates can be composites or laminates. In some examples, the substrate comprises an organo-silicate material. Substrates can be flat, round, spherical, rod-shaped, or any other suitable shape. Substrates can be rigid or flexible. In some examples, a substrate is a bead or a flow cell.

In some examples, a substrate includes a patterned surface. A "patterned surface" refers to an arrangement of different regions in or on an exposed layer of a substrate. For example, one or more of the regions may be features where one or more capture primers are present or may be coupled to the surface at a later time. The features can be separated by interstitial regions where capture primers are not present. In some examples, the pattern may be an x-y format of features that are in rows and columns. In some examples, the pattern may be a repeating arrangement of features and/or interstitial regions. In some examples, the pattern may be a random arrangement of features and/or interstitial regions. In some examples, the features may include recesses. In some examples, "recesses" may include wells, depressions, microwells, or nanowells. In some examples, the substrate includes an array of recesses in a surface. The wells may be provided by substantially vertical sidewalls. Sidewalls may also be angled or sloping. The recess may or may not have a re-entrant geometry. In some examples, the substrate includes an array of posts, domes, and/or ridges (protrusions) in a surface. Recesses and posts may be fabricated as is generally known in the art using a variety of techniques, including, but not limited to, photolithography, stamping techniques, molding techniques, nano-imprint lithography, and microetching techniques. As will be appreciated by those in the art, the technique used will depend on the composition and shape of the array substrate. Illustratively, posts having diameters between about 50 nm to about 500 nm may be referred to as nanoposts, and may have heights of similar dimension to the diameters.

The features in a patterned surface of a substrate may include an array of features (e.g., recesses such as microwells or nanowells, or posts such as nanoposts) on glass, silicon, plastic or other suitable material(s) with patterned, covalently-linked gel such as poly(N-(5-azidoacetamidyl-pentyl) acrylamide-co-acrylamide) (PAZAM). The process creates gel pads used for sequencing that may be stable over sequencing runs with a large number of cycles. The covalent linking of the polymer to the wells may be helpful for maintaining the gel in the structured features throughout the lifetime of the structured substrate during a variety of uses. However in many examples, the gel need not be covalently linked to the wells. For example, in some conditions silane free acrylamide (SFA) which is not predominantly covalently attached to any part of the structured substrate, may be used as the gel material.

In particular examples, a structured substrate may be made by patterning a suitable material with recesses (e.g. microwells or nanowells), coating the patterned material with a gel material (e.g., PAZAM, SFA or chemically modified variants thereof, such as the azidolyzed version of SFA (azido-SFA)) and polishing the surface of the gel coated material, for example via chemical or mechanical polishing, thereby retaining gel in the recesses but removing or inactivating substantially all of the gel from the interstitial regions on the surface of the structured substrate between the recesses. Primers may be attached to gel material. A solution including a plurality of target polynucleotides (e.g., a fragmented human genome or portion thereof) may then be contacted with the polished substrate such that individual target polynucleotides will seed individual wells via interactions with primers attached to the gel material; however, the target polynucleotides will not occupy the interstitial regions due to absence or inactivity of the gel material. Amplification of the target polynucleotides may be confined to the recesses because absence or inactivity of gel in the interstitial regions may inhibit outward migration of the growing cluster. The process is conveniently manufacturable, being scalable and utilizing conventional micro- or nano-fabrication methods.

A patterned substrate may include, for example, recesses etched provided in a slide or chip. The pattern of the etchings and geometry of the recesses may take on a variety of different shapes and sizes, and such features may be physically or functionally separable from each other. Particularly useful substrates having such structural features include patterned substrates that may select the size of solid particles such as microspheres. An example patterned substrate having these characteristics is the etched substrate used in connection with BEAD ARRAY technology (Illumina, Inc., San Diego, Calif.). Nano-imprint lithography (NIL) may be used to provide wells.

In some examples, a substrate described herein forms at least part of a flow cell or is located in or coupled to a flow cell. Example flow cells and substrates for manufacture of flow cells that can be used in methods and compositions set forth herein include, but are not limited to, those commercially available from Illumina, Inc. (San Diego, CA).

As used herein, the term "fluidic channel" refers to an elongated, at least partially enclosed void or space through which a fluid can flow, e.g., through which a fluid (such as a liquid or a gas) can be directed. A fluidic channel can have a length, a width, and a height. The width and height, together, can define a cross-sectional area of the fluidic channel. The cross-section of the fluidic channel can have any suitable shape, e.g., can be completely curved, partially curved, a completely polygonal, or partially polygonal. Illustratively, the cross-section of the fluidic channel can be circular, oval, square, rectangular, or the like. The fluid can substantially fill the cross-sectional area of the fluidic channel. The fluid can flow along the length of the fluidic channel. A fluidic channel can be formed by a cover coupled to a substrate, or by coupling multiple substrates.

As used herein, the term "fluidic device" refers to a device that includes at least one fluidic channel, and optionally can include a plurality of fluidic channels.

As used herein, the term "laminar flow" is intended to indicate that there is little or no mixing of the flowed fluid with any other fluids that may be proximal or adjacent to the flowed fluid.

As used herein, the term "polymer" refers to a molecule including many repeated subunits or recurring units. Non-limiting examples of polymer structures include linear, branched, or hyper-branched polymers. Non-limiting examples of linear polymers including block copolymers, alternating copolymers, or random/statistical copolymers. Non-limiting examples of branched polymers include star polymers, star-shaped or star-block polymers including both hydrophobic and hydrophilic segments, H-shaped polymers including both hydrophobic and hydrophilic segments, dumbbell shaped polymers, comb polymers, brush polymers, dendronized polymers, ladders, and dendrimers. Polymers can be cross-linked, or lightly cross-linked, for example via covalent and/or non-covalent interactions. Polymers as described herein can be linear, branched, hyper-branched or dendritic. The polymers described herein can also be in the form of polymer nanoparticles. Other examples of polymer architectures include, but not limited to ring block polymers and coil-cycle-coil polymers. Polymers with more than one type of recurring unit can be arranged as block copolymers, random copolymers, or alternating copolymers, or mixtures thereof. The final copolymer structure can be in different architectures, including, for example, random copolymer, block copolymer, comb-shaped polymer or star-shaped polymer architectures. Different classes of polymer backbones include, but are not limited to, polyacrylamides, polyacrylates, polyurethanes, polysiloxanes, silicones, polyacroleins, polyethers, polyaryls, polyphosphazenes, polyisocyanates, poly-ols, polysaccharides, polypeptides, and combinations thereof. In some examples, the polymer includes a polyacrylamide backbone. In some other examples, the polymer includes a polyacrylate backbone. In still some other examples, the polymer includes a polyurethane backbone. In still some other examples, the polymer includes a polyphosphazene backbone. In still some other examples, the polymer includes a dendrimer backbone. A polymer can include one or more moieties that can react with one or more other moieties to form a covalent bond.

As used herein, the term "cover" refers to a substrate that may be coupled to another substrate to form a fluidic channel. As such, a cover may include any of the materials described elsewhere herein that may be included in a substrate. A cover may include the same material(s) as the substrate to which it is coupled, or may include one or more different materials than the substrate to which it is coupled. A cover may be coupled directly to a substrate, or may be coupled to an intervening layer that is coupled to a substrate. Although a region of a cover may be described and illustrated as being "over" a substrate, this is intended only to mean that the cover and the substrate are spaced apart from one another, rather than to imply any particular spatial orientation of the cover relative to the substrate. A cover may include a recess configured such that, when the cover is coupled to the substrate, the recess is spaced apart from the substrate so as to provide a fluidic channel. Conversely, the substrate may include a recess configured such that, when the cover is coupled to the substrate, the recess is spaced apart from the cover so as to provide a fluidic channel.

As used herein, the term "linker" is intended to mean a molecule or molecules via which one element is attached to another element. For example, a linker may attach a molecule to a substrate. Linkers may be covalent, or may be non-covalent. Nonlimiting examples of covalent linkers include alkyl chains, polyethers, amides, esters, aryl groups, polyaryls, and the like. Nonlimiting examples of noncovalent linkers include host-guest complexation, cyclodextrin/norbornene, adamantane inclusion complexation with β-CD, DNA hybridization interactions, streptavidin/biotin, and the like.

As used herein, the term "selectively" is intended to mean substantially affecting only the subject(s) of the action that is "selectively" being performed on such subject(s).

All ranges may include the upper and lower values, and all ranges and ratio limits disclosed herein may be combined. It is to be understood that unless specifically stated otherwise, references to "a," "an," and/or "the" may include one or more than one and that reference to an item in the singular may also include the item in the plural. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item. Further, reference to, e.g., a "first" item and a "second" item does not mean that there are no intervening items, and such intervening items may be present.

Methods for Selective Modification of Surfaces in Structures and Fluidic Devices, and Said Structures and Fluidic Devices As will be discussed below, some of the disclosed methods involve flowing a first fluid over a structure including an interstitial surface and recesses, such that each recess is filled by the first fluid. A second fluid, containing a reagent, is then flowed over the structure, displacing the first fluid that is not within the recesses and is over the interstitial surface. The second fluid is then used to modify the interstitial surface. Alternatively, the second fluid may be flowed first, followed by the first fluid, such that the inner surfaces of each recess are modified instead of the interstitial surface. In some examples, the fluid within the recesses is solidified so as to provide a more stable way to block reagents from contacting the surfaces of the recesses themselves.

Figure 5:
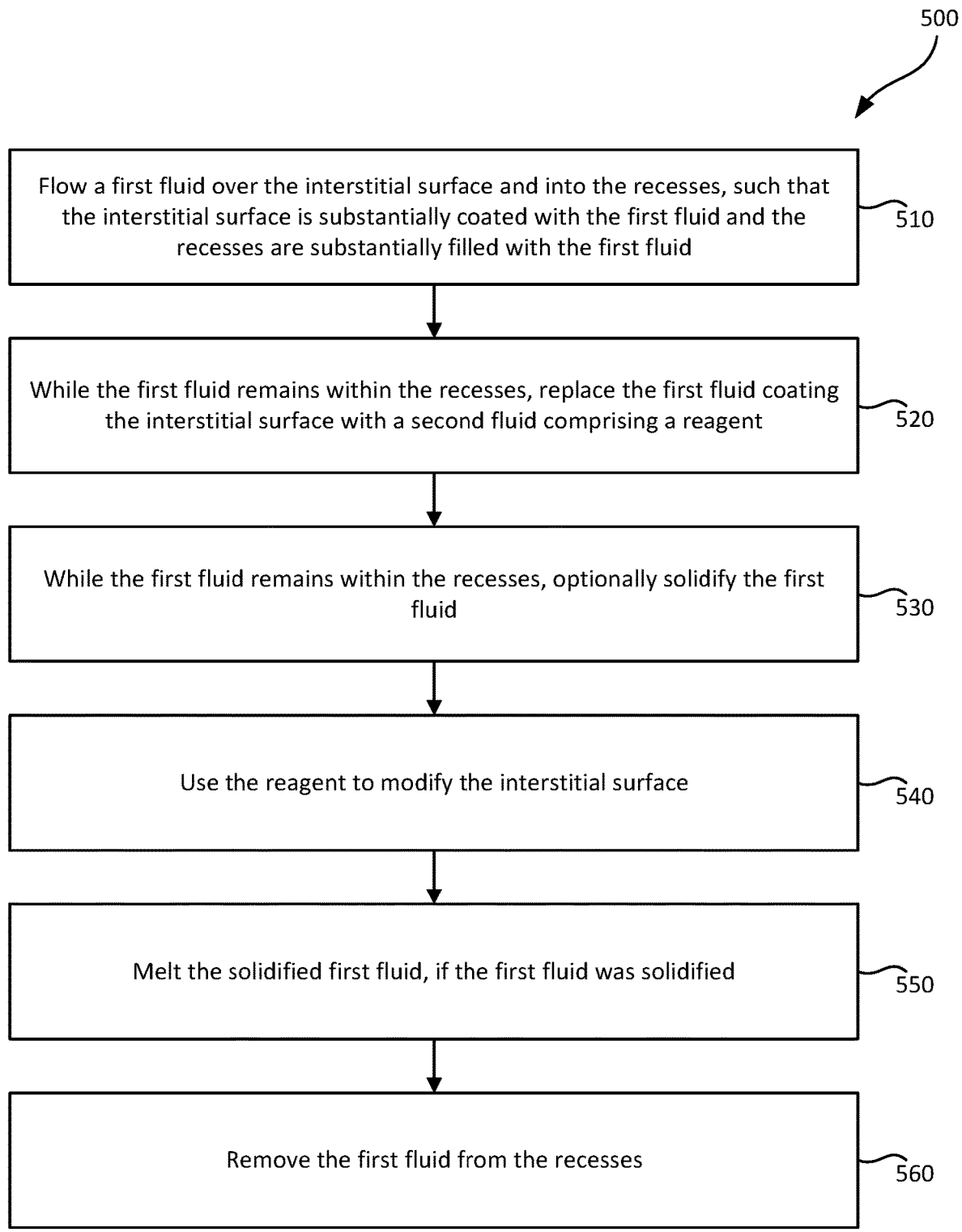
FIG. 5 illustrates a flow of operations in an example method for selectively modifying an interstitial surface, in accordance with various examples.

FIG. 5 illustrates a flow of operations in an example method for selectively modifying an interstitial surface, in accordance with various examples. FIGS. 1A-1F illustrate example structures and operations for selectively modifying an interstitial surface, in accordance with various examples. Optionally, operations illustrated in FIG. 5 may be used to create the structures described with reference to FIGS. 1A-1F.

For example, with reference to FIG. 1A, structure 100 may include substrate 110 and patterned material 120. Patterned material 120 may include interstitial surface 122. Patterned material 120 may form the sidewalls of recesses 124. Substrate 110 may form the bottom wall of recesses 124. In various examples, patterned material 120 may include a photoresist. In various examples, the photoresist includes SU-8. Substrate 110 may include any suitable material. Substrate 110 may include a material that is different than patterned material 120. In various examples, substrate 110 may include a glass, a semiconductor, or a polymer. In various examples, electrodes (not shown) may be disposed on substrate 110 within recesses 124. Structure 100 may optionally include cover 130. Cover 130 may be disposed over interstitial surface 122 and recesses 124. Cover 130 and interstitial surface 122 together may form fluidic channel 132 between cover 130 and interstitial surface 122.

With additional reference to FIG. 5 (operation 510), in various examples, first fluid 140 (such as a liquid or a gas) may be flowed over interstitial surface 122, such that first fluid 140 substantially fills recesses 124 and substantially covers interstitial surface 122. In various examples where cover 130 is present, first fluid 140 may be flowed into fluidic channel 132 using laminar flow. In operation, first fluid 140 flowing through fluidic channel 132 can be pressurized to any suitable level and may have any suitable temperature. A structure in accordance with various examples of this disclosure can be made in any suitable manner. In various examples, interstitial surface 122 and recesses 124 may be located within a flow cell. In various examples, recesses 124 may include a microwell. In such examples, recesses 124 may be filled with first fluid 140 using capillary action, capillary electrophoresis, dissolution guided wetting, or electrowetting. A flow cell in accordance with various examples of this disclosure can be made in any suitable manner.

The fluid in contact with the interstitial surface may be displaced by another fluid. For example, referring now to FIG. 1B, structure 100 may also include second fluid 150 (such as a liquid or a gas). Second fluid 150 may include a reagent. In various examples, the reagent may include a hydrogel, a biomolecule, streptavidin, DNA, a reagent for cleavage, or a reagent for capture. In some examples, a reagent for cleavage can include any chemical(s) or chemical-loaded nanoparticles, beads, or molecular cage(s) that can break a chemical bond or molecular interaction. For example, DTT or TCEP may be used to break a disulfide bond; other suitable chemicals may be used for reversible chemistry; high concentration biotin may be used to break or displace biotin-streptavidin interaction; various cleavage reagents may be used for SBS and/or deblocking chemistry; high salt may be used for weakening electrostatic interaction; NaOH, formamide, and/or DMSO may be used for DNA dehybridization or reducing secondary structure; DNA or PNA oligos may be used for strand invasion; or the like. Reagents for capture can include any chemical(s) or chemical-loaded nanoparticles, beads, or molecular cages that can form a chemical bond or molecular interaction, e.g. streptavidin or streptavidin-coated beads for biotinylated molecule capture, reagents/chemicals for Spytag-spycatcher, Ni-NTA-Histag, boronic acid-saccharides, Native chemical ligation, hydrozone chemistry; reagents/chemicals for click chemistry (thiol-ene/thiol-michael, amino-yne, alkyne-azide, DBCO-azide); reagents/chemicals for host-guest chemistry, antigen-antibody, oligos or oligo-immobilized particles for DNA capture/hybridization, DNA intercalators, or DNA binding proteins. In other examples, the reagents can be any additives for controlling sequencing speed/accuracy.

With additional reference to FIG. 5 (operation 520), second fluid 150 may be flowed over interstitial surface 122 so as to displace first fluid 140 from interstitial surface 122, while leaving recesses 124 substantially filed by first fluid 140. In various examples where cover 130 is present, second fluid 150 may be flowed into fluidic channel 132 using laminar flow. In operation, second fluid 140 flowing through fluidic channel 132 can be pressurized to any suitable level and may have any suitable temperature. In other examples, cover 130 may be removed or omitted, and interstitial surfaces 122 exposed to second fluid 150. First fluid 140 may substantially inhibit the reagent in second fluid 150 from modifying recesses 124. For example, first fluid 140 and second fluid 150 may be substantially immiscible with each other. This property inhibits the reagent in second fluid 150 from flowing into first fluid 140. This property also allows first fluid 140 to inhibit the modification of recesses 124 by second fluid 150 or the reagent. Any combination of immiscibility may be used, depending on the properties of substrate 110, patterned material 120, and the reagent. In various examples, first fluid 140 is polar and second fluid 150 is nonpolar. In various examples, first fluid 140 is aqueous and second fluid 150 is organic. Illustratively, first fluid 140 may be or include water, and second fluid 150 may be selected from the group consisting of octane, tetradecafluorohexane, hexane, hexadecane, squalene, dodecane, and silicone oil. Second fluid 150 may be flowed through channel 132 at any suitable rate, e.g., at a rate of about 0.01 µL/second to about 10 µL/second, e.g., about 0.05 µL/second to about 5 µL/second, e.g., about 0.01 µL/second to about 2 µL/second. In other various examples, first fluid 140 is nonpolar and second fluid 150 is polar. In various examples, first fluid 140 is organic and second fluid 150 is aqueous. Optionally, the density of first fluid 140 may be greater than the density of second fluid 150. Alternatively, the density of first fluid 140 may be less than the density of second fluid 150. Any suitable combination of solvents, each of which may have any suitable density, viscosity, or volatility may be used, at any suitable flow rates (e.g., at a rate of less than about 0.01 µL/second, or at a rate of more than about 10 µL/second).

It will further be appreciated that first fluid 140 and second fluid 150 may be in any suitable respective phase(s) of matter. In some examples, first fluid 140 and second fluid 150 both may be or include liquids, e.g., in a manner such as described with reference to Examples 1, 2, and 5 below. In some examples, the ratio of the first liquid to the second liquid may be titrated. In other examples, first fluid 140 is solidified in a manner such as will now be described with reference to FIG. 1C, and second fluid 150 may be or include a gas, e.g., in a manner such as described with reference to Example 4. In still other examples, first fluid 140 may be or include a gas, and second fluid 150 may be or include a liquid, e.g., in a manner such as described with reference to Example 3. Still other suitable combinations may be envisioned, and are encompassed herein. Similar variations are equally applicable to each of the other examples described herein.

In some examples, method 500 illustrated in FIG. 5 stops after operation 520. In other examples, method 500 illustrated in FIG. 5 optionally continues after operation 520, e.g., with one or more of operations 530 to 560 which will now be described.

Optionally, the fluid contained within the recesses may be solidified. The fluid in contact with the interstitial surface may then modify the interstitial surface. Then the fluid in contact with the interstitial surface may be removed from the structure. For example, referring now to FIG. 1C and FIG. 5 (operation 530), while first fluid 140 remains within recesses 124, first fluid 140 optionally may be solidified to form solidified first fluid 141. In other examples, first fluid 140 need not be solidified in order to remain within recesses 124. For example, interfacial forces and/or gravity may retain first fluid 140 within recesses 124. Optionally, first fluid 140 may include a second reagent that reacts within recesses 124 to functionalize the material of the recesses. The second reagent of first fluid 140 may be different than the reagent of second fluid 150. This option applies to other examples described elsewhere herein.

In nonlimiting examples in which first fluid is solidified, first fluid 140 may be a stimuli-responsive material that undergoes a reversible transition from a solution phase to a gel phase. In various examples, first fluid 140 may also undergo a reversible transition from a gel phase to a solution phase. In various examples, first fluid 140 may undergo a reversible sol-gel transition. In various examples, first fluid 140 may be or include a colloid. In some examples, first fluid 140 may be or include a suspension. In some examples, first fluid 140 may be or include a liquid or solution.

First fluid 140 may be solidified by various means. In various examples, first fluid 140 may be solidified using a change in temperature. In various examples, first fluid 140 may be solidified by the active cooling of first fluid 140. In various examples, first fluid 140 may be solidified by passively allowing substrate 110 to cool to ambient temperature. Illustratively, first fluid 140 may include agarose, gelatin, one or more other polysaccharides, or one or more other low melting point polymers, where the agarose, gelatin, other polysaccharide(s), or other low melting point polymer(s) solidifies responsive to a sufficient reduction in temperature.

In various examples, first fluid 140 may be solidified by the active heating of first fluid 140. In various examples, first fluid 140 may be heated via the active heating of substrate 110. Illustratively, first fluid 140 may include poly(N-isopropyl acrylamide), where the poly(N-isopropyl acrylamide) solidifies responsive to a sufficient increase in temperature.

In other various examples, first fluid 140 may be solidified using a change in pH. Illustratively, first fluid 140 may include polyacrylic acid, where the polyacrylic acid solidifies responsive to a sufficient increase in pH level.

In still other various examples, first fluid 140 may be solidified using light, mechanical force, a reactive gas, an electrical field, a magnetic field, or a chemical. For example, first fluid 140 may include alginate, carboxycellulose, or gellan gum, where the alginate, carboxycellulose, or gellan gum solidifies in the presence of multivalent cations. Or, for example, first fluid 140 may include sodium polyacrylate, where the sodium polyacrylate solidifies in the presence of low salt media. Or, for example, first fluid 140 may include one or more polyamines, polysaccharides, or polypeptides, or one or more precursors to polyacrylates, polythiols, polysulfones, polyamines, polyamides, polysaccharides, polypeptides, or polyesters. Such precursor(s) may be gelated using UV light. Fluid 140 may also include precursor chemicals containing reactive groups, such as (meth) acrylates, alkynes, or thiols, that form a gel, gel-like, or solid material in the presence of an initiator. In some examples, the initiator may be or include a chemical compound that induces the formation of radical species in the presence of temperature, light, or a combination thereof. Nonlimiting classes of initiator compounds include peroxides, azo compounds, sulfonates, sulfoniums, phenones, and the like. It would be apparent to one skilled in the art that different combinations of these components may be appropriate or beneficial depending on the identities of the reagent in second fluid 150, substrate 110, and patterned material 120.

Referring now to FIG. 5 (operation 540), independently of whether first fluid 140 is solidified or not, second fluid 150 may then modify interstitial surface 122. In some examples, the reagent in second fluid 150 is what modifies interstitial surface 122. For example, referring now to FIG. 1D, second fluid 150 may then be removed, leaving behind interstitial surface modifications 151. Interstitial surface modifications 151 may have the property that the contact angle of water with the interstitial surface modifications 151 is between about 60 degrees and about 120 degrees, between about 70 degrees and about 110 degrees, between about 80 degrees and about 100 degrees, between about 85 degrees and about 95 degrees, or about 90 degrees.

In various examples, second fluid 150 may include a silane. In these examples, second fluid 150 may include one or more of (3-aminopropyl)triethoxysilane (APTES), 3-cyanopropyl-trimethoxysilane (CPTMS), 3-(trimethoxysilyl) propyl acrylate (TRI), 3-azidopropyltriethoxysilane (Azido C3), n-propyltrimethoxysilane (C3), methoxytrimethylsilane (MDS), n-octyltrimethoxysilane (C8), (tridecafluoro-1,1,2,2-tetrahydrooctyl)tri-methoxysilane (FOTMS), perfluoro(polypropyleneoxy)methoxypropyltri-methoxysilane (PPFTMS), or a mercapto-silane. In some examples, the silane is carried by an aqueous solvent, e.g., as described with reference to Examples 3 and 5. In other examples, the silane is carried by an organic solvent, e.g., as described with reference to Example 2. In still other examples, the silane is in the vapor phase, e.g., as described with reference to Example 4.

Figure 9:
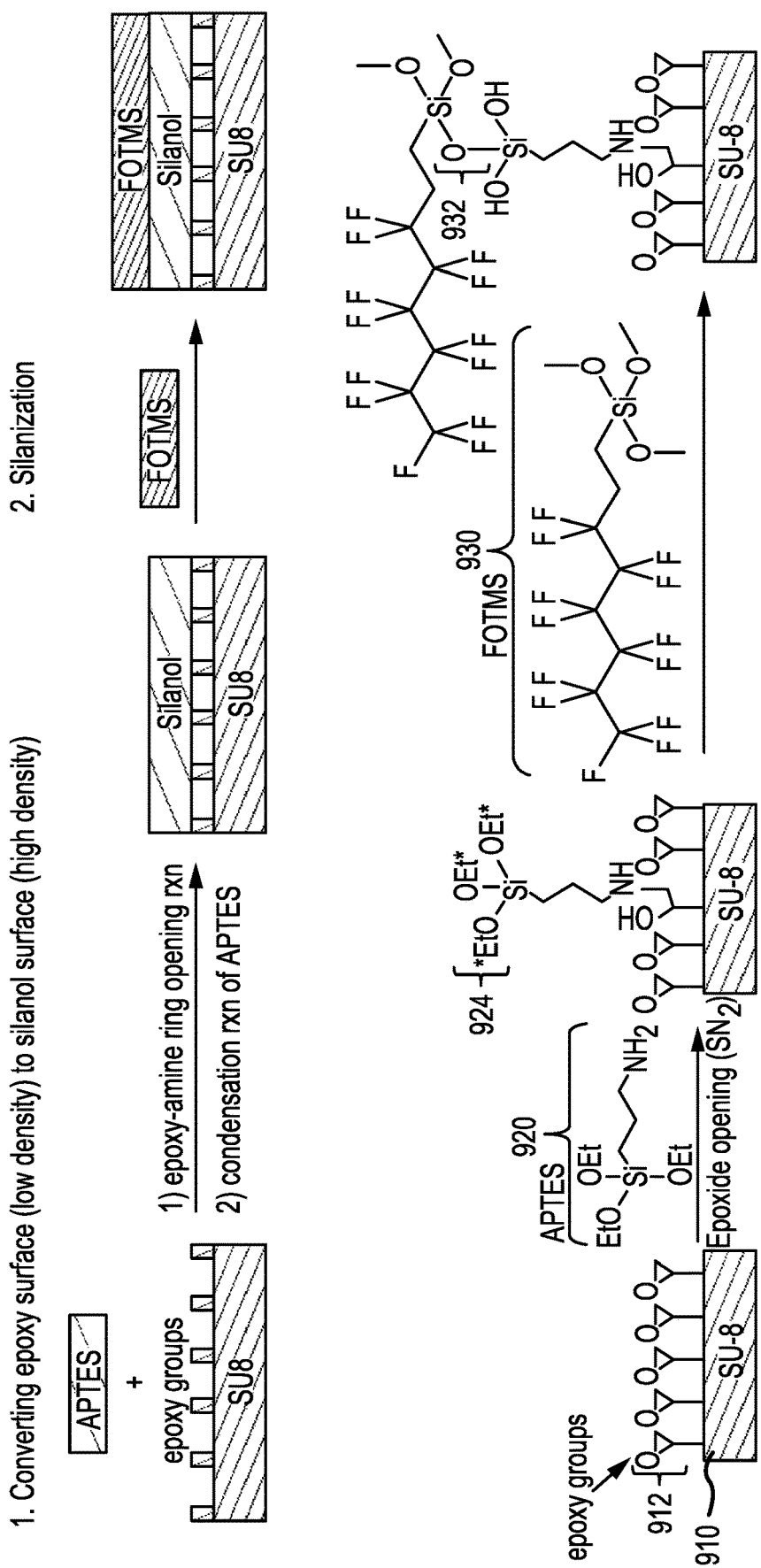
FIG. 9 illustrates an example reaction between a fluid containing a silane and an SU-8 photoresist substrate, in accordance with various examples.

FIG. 9 illustrates an example reaction between a fluid containing a silane and an SU-8 photoresist substrate, in accordance with various examples. With additional reference to FIG. 9, in various examples, where patterned surface 120 includes photoresist 910, APTES 920 (or other suitable second fluid, which in some examples may be or include a silane) may react with residual epoxide groups 912 on the surface of photoresist 910. In various examples, photoresist 910 may include SU-8, including SU-8 commercially available from Kayaku Advanced Materials (Westborough, MA). For example, the amine group of APTES 920 may react with photoresist epoxide groups 912. Alternatively, a mercapto-silane may react with residual epoxide groups 912. The silane ethoxy groups 924 from APTES 920 or from the mercapto-silane may be hydrolyzed or condensed to form silanol groups. Interstitial surface modifications 151 may include silane ethoxy groups 924. The silanol groups may then be reacted with a silane, for example FOTMS 930, to form a siloxane bond 932 and give the photoresist 910 surface the desired property. In various examples, CPTMS, TRI, Azido C3, C3, MDS, C8, or PPFTMS may be reacted to the silanol groups instead of FOTMS 930. In various examples, CPTMS, TRI, Azido C3, C3, MDS, C8, or PPFTMS may be reacted to the silanol groups in addition to FOTMS 930. The identity of the selected silane(s) will influence the properties of the resulting modified photoresist surface. For example, selection of CPTMS, TRI, Azido C3, C3 MDS, C8, FOTMS, or PPFTMS may cause the resulting modified surface to have a contact angle with water of about 60 degrees to about 120 degrees, for example, of about 60 degrees, of about 70 degrees, of about 80 degrees, of about 90 degrees, of about 100 degrees, of about 110 degrees, or of about 120 degrees, respectively. The selected silane(s) may cause the resulting modified surface to have a contact angle with water of between about 60 degrees and about 120 degrees, between about 70 degrees and about 110 degrees, or between about 80 degrees and about 100 degrees. The reaction conditions with the selected silane(s) may vary with the identity of the selected silane. It will be appreciated that other species besides silanes may be used to modify an oxide surface, such as a phosphonic acid.

In nonlimiting examples in which a solidified fluid is used to inhibit contact between the reagent and the sidewalls, the solidified fluid contained within the recesses subsequently may be melted. The melted fluid may then be removed from the recesses. For example, referring now to FIG. 1E and FIG. 5 (operation 550), solidified first fluid 141 may be then melted to re-form first fluid 140, if the first fluid was solidified. In various examples, solidified first fluid 141 may be melted using a change in temperature. In examples where first fluid 140 is solidified by sufficiently reducing the temperature, solidified first fluid 141 may be melted by sufficiently increasing the temperature. For example, solidified first fluid 141 may include agarose, gelatin, one or more other polysaccharides, or one or more other low melting point polymers, where the agarose, gelatin, other polysaccharide(s), or other low melting point polymer(s) melts responsive to a sufficient increase in temperature. In examples where first fluid 140 is solidified by sufficiently increasing the temperature, solidified first fluid 141 may be melted by sufficiently reducing the temperature. For example, solidified first fluid 141 may include poly(N-isopropyl acrylamide), where the poly(N-isopropyl acrylamide melts responsive to a sufficient reduction in temperature. In various examples, solidified first fluid 141 may be melted using a change in pH. In examples where first fluid 140 is solidified by sufficiently increasing the pH level, solidified first fluid 141 may be melted by sufficiently reducing the pH level. For example, solidified first fluid 141 may include polyacrylic acid, where the polyacrylic acid melts responsive to a sufficient reduction in pH level. In examples where first fluid 140 is solidified using light, mechanical force, a reactive gas, an electrical field, a magnetic field, or a chemical, solidified first fluid 141 may be melted using light, mechanical force, a reactive gas, an electrical field, a magnetic field, or a chemical. For example, solidified first fluid 141 may include alginate, carboxycellulose, or gellan gum, where the alginate, carboxycellulose, or gellan melts in the presence of cation chelating agents. Or, for example, solidified first fluid 141 may include sodium polyacrylate, where the sodium polyacrylate melts responsive to an appropriate increase in salt concentration. Or, for example, solidified first fluid 141 may include one or more polyamines, polysaccharides, polypeptides, polyacrylates, polythiols, polysulfones, polyamides, or polyesters that are liquified responsive to suitable stimulus. It would be apparent to one skilled in the art that different combinations of these components may be appropriate or beneficial depending on the identities of the reagent in second fluid 150, substrate 110, or patterned material 120.

Referring now to FIG. IF and FIG. 5 (operation 560), first fluid 140 may be removed from recesses 124. For example, first fluid 140 may be removed using evaporation, heating, freeze drying, suction, or by other means. For example, first fluid 140 may be washed away with another fluid, blowing it out with air, exposure to a reactive gas, sonication, or laser ablation. Or, for example first fluid 140 may be rinsed or soaked with a solvent or a series of solvents that the first fluid 140 has good solubility in, optionally with assistance of sonication, wiping, agitation, electric bias, acoustic energy, or magnetic force. For example, magnetic beads or liquid can be added to the first fluid 140.

Another method is to apply agarose or the same material as to fluid 140 to the surface, allow it to solidify and adhere to the fluid inside wells. Once solidified together, the fluid 140 inside wells can be peeled off or rinsed off with the top layer as a whole piece. Other polymer can also be applied as a thin film to the surface, the film together with adhered fluid 140 can be peeled off or rinsed off.

If alternative hydrogel or polymer is used, UV, pH, reducing reagents or other chemicals can be used to break the gel depending on the nature of the cross-linking bonds of the polymer/hydrogel.

Figure 6:
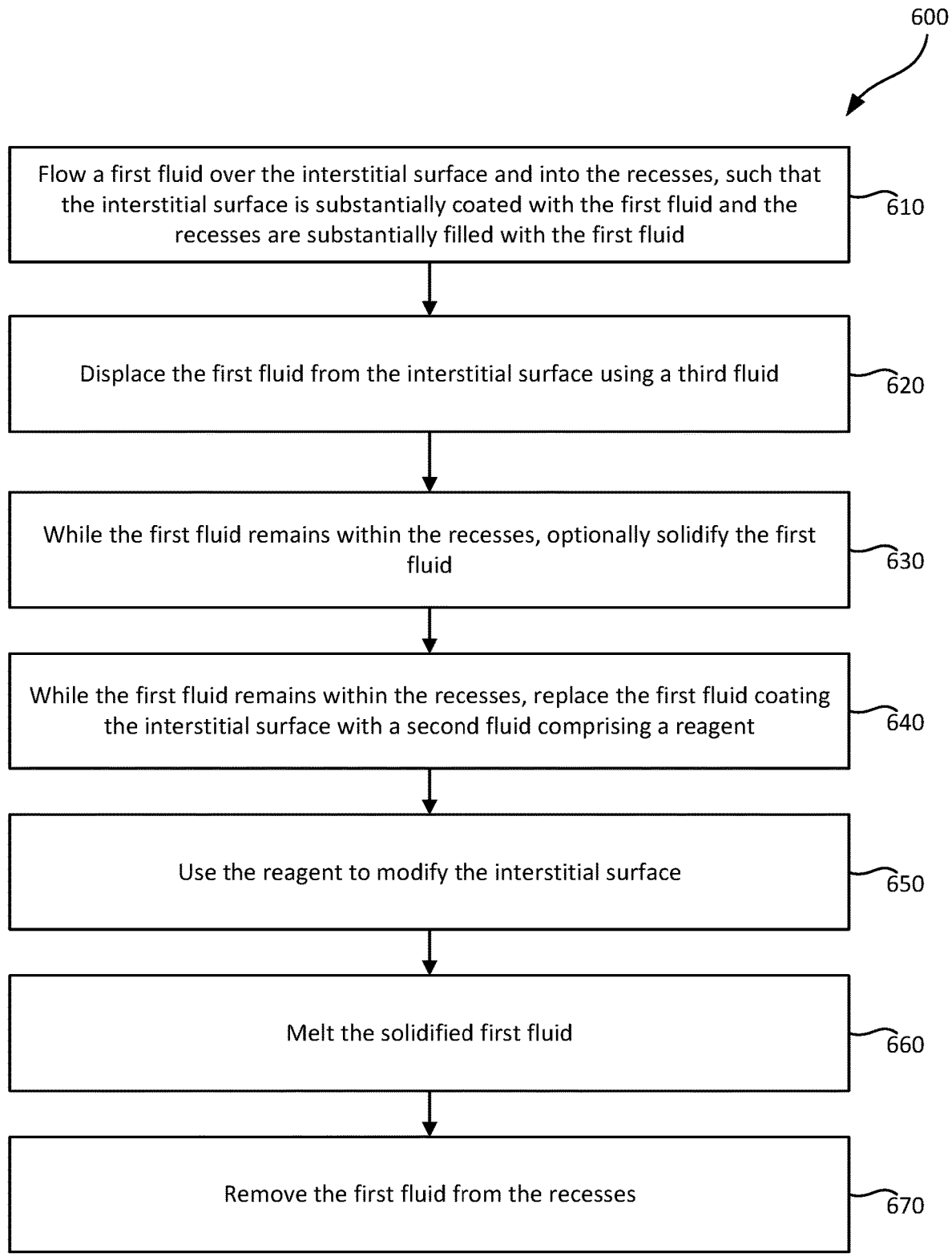
FIG. 6 illustrates a flow of operations in an example method for selectively modifying an interstitial surface, in accordance with various examples.

A method for selectively modifying an interstitial surface may include displacing the first fluid from the interstitial surface with a third fluid prior to the solidification of the first fluid. For example, FIG. 6 illustrates a flow of operations in an example method for selectively modifying an interstitial surface, in accordance with various examples. FIGS. 2A-2F illustrate example structures and operations for selectively modifying an interstitial surface, in accordance with various examples. Optionally, operations illustrated in FIG. 6 may be used to create the structures described with reference to FIGS. 2A-2F.

Figure 2A:
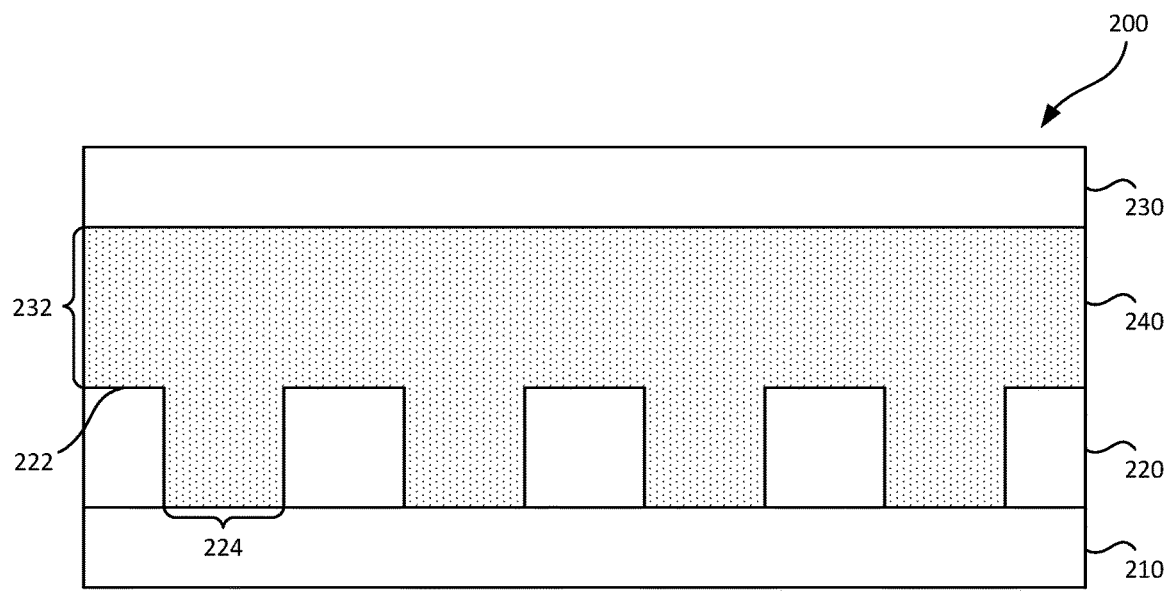
FIGS. 2A-2F illustrate example structures and operations for selectively modifying an interstitial surface, in accordance with various examples.
Figure 2B:
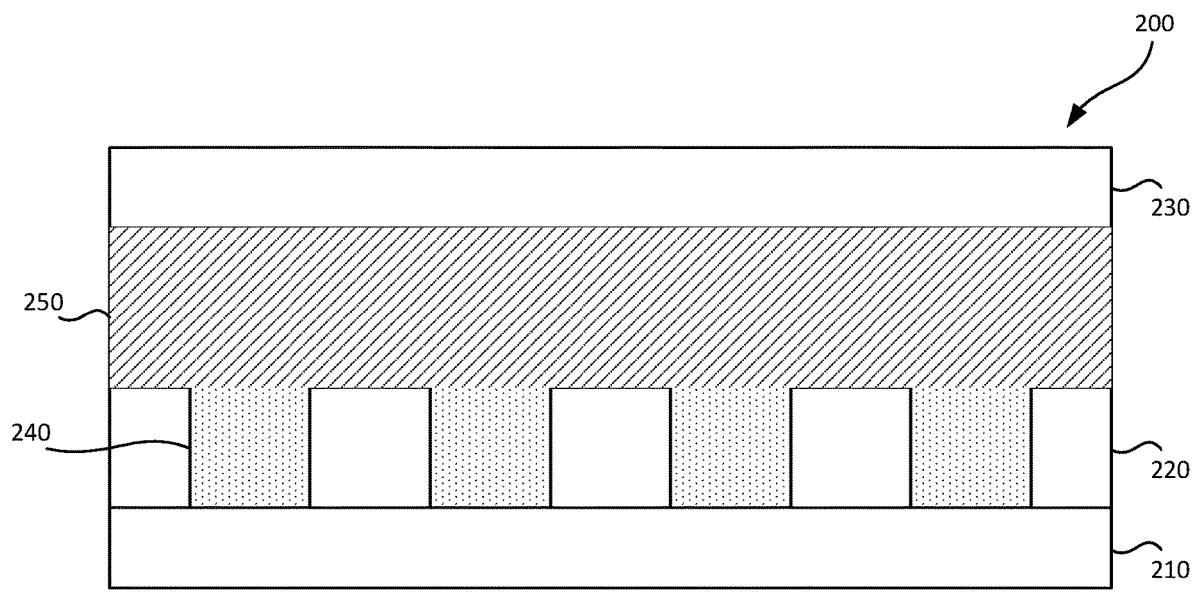
Figure 2C:
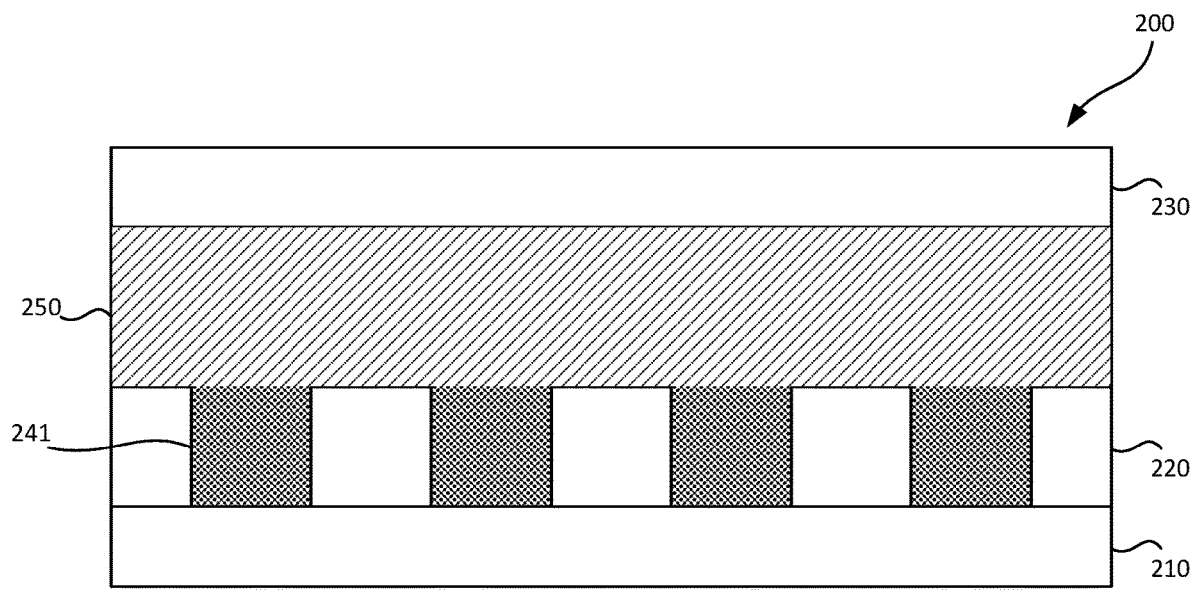

For example, with reference to FIG. 2A, structure 200 may include substrate 210 and patterned material 220. Patterned material 220 may include interstitial surface 222. Patterned material 220 may form the sidewalls of recesses 224. Substrate 210 may form the bottom wall of recesses 224. In various examples, patterned material 220 may include a photoresist. In various examples, the photoresist includes SU-8. Substrate 210 may include any suitable material. Substrate 210 may include a material that is different than patterned material 220. In various examples, substrate 210 may include a glass, a semiconductor, or a polymer. In various examples, electrodes (not shown) may be disposed on substrate 210 within recesses 224. Structure 200 may optionally include cover 230. Cover 230 may be disposed over interstitial surface 222 and recesses 224. Cover 230 may form fluidic channel 232 between cover 230 and interstitial surface 222.

With additional reference to FIG. 6 (operation 610), in various examples, first fluid 240 may be flowed over interstitial surface 222 such that first fluid 240 substantially fills recesses 224. In operation, first fluid 240 flowing through fluidic channel 232 can be pressurized to any suitable level and may have any suitable temperature. A structure in accordance with various examples of this disclosure can be made in any suitable manner. In various examples where cover 230 is present, first fluid 240 may be flowed into fluidic channel 232 using laminar flow. In various examples, interstitial surface 222 and recesses 224 may be located within a flow cell. In various examples, recesses 224 may include a microwell. In such examples, recesses 224 may be filled with first fluid 240 using capillary action. A flow cell in accordance with various examples of this disclosure can be made in any suitable manner.

The fluid in contact with the interstitial surface may be displaced by another fluid. For example, referring now to FIG. 2B and FIG. 6 (operation 620), structure 200 may also include third fluid 250 (in this regard, note that terms such as "first," "second," and "third" should not be interpreted as requiring use in any particular order). Third fluid 250 may be flowed over interstitial surface 222 so as to displace first fluid 240 from interstitial surface 222, while leaving recesses 224 substantially filed by first fluid 240. In various examples where cover 230 is present, third fluid 250 may be flowed into fluidic channel 232 using laminar flow. In operation, third fluid 250 flowing through fluidic channel 232 can be pressurized to any suitable level and may have under any suitable temperatures. For examples, first fluid 240 and third fluid 250 may be miscible with each other.

In some examples, method 600 illustrated in FIG. 6 stops after operation 620. In other examples, method 600 illustrated in FIG. 6 optionally continues after operation 620, e.g., with one or more of operations 630 to 670 which will now be described.

Optionally, the fluid contained within the recesses may be solidified. The fluid in contact with the interstitial surface may then modify the interstitial surface. Then the fluid in contact with the interstitial surface may be removed from the structure. For example, referring now to FIG. 2C and FIG. 6 (operation 630), first fluid 240 optionally may be solidified to form solidified first fluid 241. Alternatively, first fluid 240 may remain within the recesses without being solidified.

In some examples, first fluid 240 may be a stimuli-responsive material that undergoes a reversible transition from a solution phase to a gel phase. In various examples, first fluid 240 may also undergo a reversible transition from a gel phase to a solution phase. In various examples, first fluid 240 may undergo a reversible sol-gel transition. In various examples, first fluid 240 may be or include a colloid. In some examples, first fluid 240 may be or include a suspension. In some examples, first fluid 240 may be or include a liquid or solution.

In some examples, first fluid 240 may be solidified by various means. In various examples, first fluid 240 may be solidified using a change in temperature. In various examples, first fluid 240 may be solidified by the active cooling of first fluid 240. In various examples, first fluid 240 may be solidified by passively allowing substrate 210 to cool to ambient temperature. Illustratively, first fluid 240 may include agarose, gelatin, one or more other polysaccharides, or one or more other low melting point polymers, where the agarose, gelatin, other polysaccharide(s), or other low melting point polymer(s) solidifies responsive to a sufficient reduction in temperature.

In various examples, first fluid 240 may be solidified by the active heating of first fluid 240. In various examples, first fluid 240 may be heated via the active heating of substrate 210. Illustratively, first fluid 240 may include poly(N-isopropyl acrylamide), where the poly(N-isopropyl acrylamide) solidifies responsive to a sufficient increase in temperature.

In other various examples, first fluid 240 may be solidified using a change in pH. Illustratively, first fluid 240 may include polyacrylic acid, where the polyacrylic acid solidifies responsive to a sufficient increase in pH level. In still other various examples, first fluid 240 may be solidified using light, mechanical force, a reactive gas, an electrical field, a magnetic field, or a chemical. For example, first fluid 240 may include alginate, carboxycellulose, or gellan gum, where the alginate, carboxycellulose, or gellan gum solidifies in the presence of multivalent cations. Or, for example, first fluid 240 may include sodium polyacrylate, where the sodium polyacrylate solidifies in the presence of low salt media. Or, for example, first fluid 240 may include one or more polyamines, polysaccharides, polypeptides, or one or more precursors to polyacrylates, polythiols, polysulfones, polyamines, polyamides, polysaccharides, polypeptides, or polyesters. Such precursors may be gelated using UV light. It would be apparent to one skilled in the art that different combinations of these components may be appropriate or beneficial depending on the identities of the reagent in second fluid 260, of third fluid 250, substrate 210, and patterned material 220.

Figure 2D:
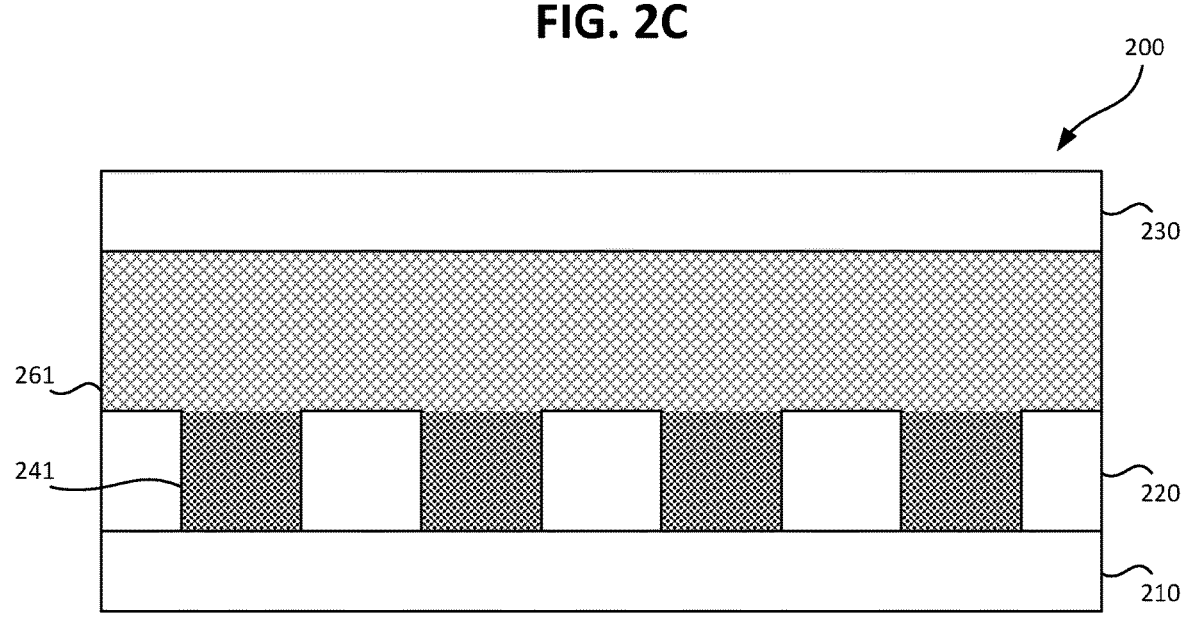
Figure 2E:
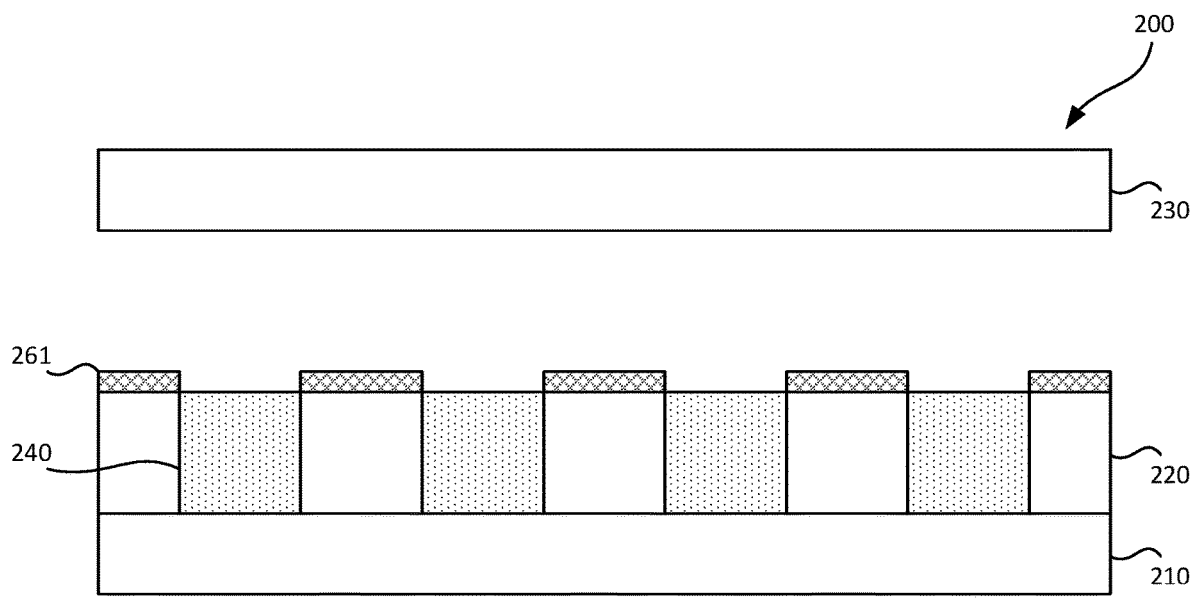

Referring now to FIG. 2D and FIG. 6 (operation 640), structure 200 may also include second fluid 260. Second fluid 260 may include a reagent. In various examples, the reagent may include a hydrogel, a biomolecule, streptavidin, DNA, a reagent for cleavage, or a reagent for capture. Second fluid 260 may be flowed over interstitial surface 222 so as to displace third fluid 250 from interstitial surface 222, while leaving recesses 224 substantially filed by first fluid 240, which optionally may be solidified into first fluid 241. In various examples where cover 230 is present, second fluid 260 may be flowed into fluidic channel 232 using laminar flow. In operation, second fluid 260 flowing through fluidic channel 232 can be pressurized to any suitable level and may have any suitable temperature. Second fluid 260 and third fluid 250 may be substantially immiscible with each other. Any combination of immiscibility may be used, depending on the properties of substrate 210, patterned material 220, and solidified first fluid 241. In various examples, second fluid 260 is polar and third fluid 250 is nonpolar. In various examples, second fluid 260 is aqueous and third fluid 250 is organic. In other various examples, second fluid 260 is nonpolar and third fluid 250 is polar. In various examples, second fluid 260 is organic and third fluid 250 is aqueous. However, it will be appreciated that the first fluid, second fluid, and third fluid may be in any suitable phase(s) of matter (e.g., may be solid, liquid, or gas).

Referring now to FIG. 6 (operation 650), second fluid 260 may then modify interstitial surface 222. It may be that the reagent in second fluid 260 is what modifies interstitial surface 222. For example, referring now to FIG. 2E, second fluid 260 may then be removed, leaving behind interstitial surface modifications 261. Interstitial surface modifications 261 may have the property that the contact angle of water with interstitial surface modifications 261 is between about 60 degrees and about 120 degrees, between about 70 degrees and about 110 degrees, between about 80 degrees and about 100 degrees, between about 85 degrees and about 95 degrees, or about 90 degrees. In various examples, second fluid 260 may include a silane. In these examples, second fluid 260 may include one or more of (3-aminopropyl) triethoxysilane (APTES), 3-cyanopropyl-trimethoxysilane (CPTMS), 3-(trimethoxysilyl)propyl acrylate (TRI), 3-azidopropyltriethoxysilane (Azido C3), n-propyltrimethoxysilane (C3), methoxytrimethylsilane (MDS), n-octyltrimethoxysilane (C8), (tridecafluoro-1,1,2,2-tetrahydrooctyl)tri-methoxysilane (FOTMS), perfluoro (polypropyleneoxy)methoxypropyltri-methoxysilane (PPFTMS), or a mercapto-silane.

FIG. 9 illustrates an example reaction between a fluid containing a silane and an SU-8 photoresist substrate, in accordance with various examples. With additional reference to FIG. 9, in various examples, where patterned surface 220 includes photoresist 910, APTES 920 (or other suitable fluid, which may be or include a silane in some examples) may react with residual epoxide groups 912 on the surface of photoresist 910. In various examples, photoresist 910 may include SU-8, including SU-8 commercially available from Kayaku Advanced Materials (Westborough, MA). For example, the amine group of APTES 920 may react with photoresist epoxide groups 912. Alternatively, a mercapto-silane may react with residual epoxide groups 912. The silane ethoxy groups 924 from APTES 920 or from the mercapto-silane may be hydrolyzed or condensed to form silanol groups. Interstitial surface modifications 151 may include silane ethoxy groups 924. The silanol groups may then be reacted with a silane, for example FOTMS 930, to form siloxane bond 932 and give the photoresist surface the desired property. In various examples, CPTMS, TRI, Azido C3, C3, MDS, C8, or PPFTMS may be reacted to the silanol groups instead of FOTMS 930. In various examples, CPTMS, TRI, Azido C3, C3, MDS, C8, or PPFTMS may be reacted to the silanol groups in addition to FOTMS 930. The identity of the selected silane(s) may influence the properties of the resulting modified photoresist surface. For example, selection of CPTMS, TRI, Azido C3, C3 MDS, C8, FOTMS, or PPFTMS may cause the resulting modified surface to have a contact angle with water of about 60 degrees to about 120 degrees, for example, of about 60 degrees, of about 70 degrees, of about 80 degrees, of about 90 degrees, of about 100 degrees, of about 110 degrees, or of about 120 degrees, respectively. The selected silane(s) may cause the resulting modified surface to have a contact angle with water of between about 60 degrees and about 120 degrees, between about 70 degrees and about 110 degrees, or between about 80 degrees and about 100 degrees. The reaction conditions with the selected silane(s) may vary with the identity of the selected silane.

Figure 2F:
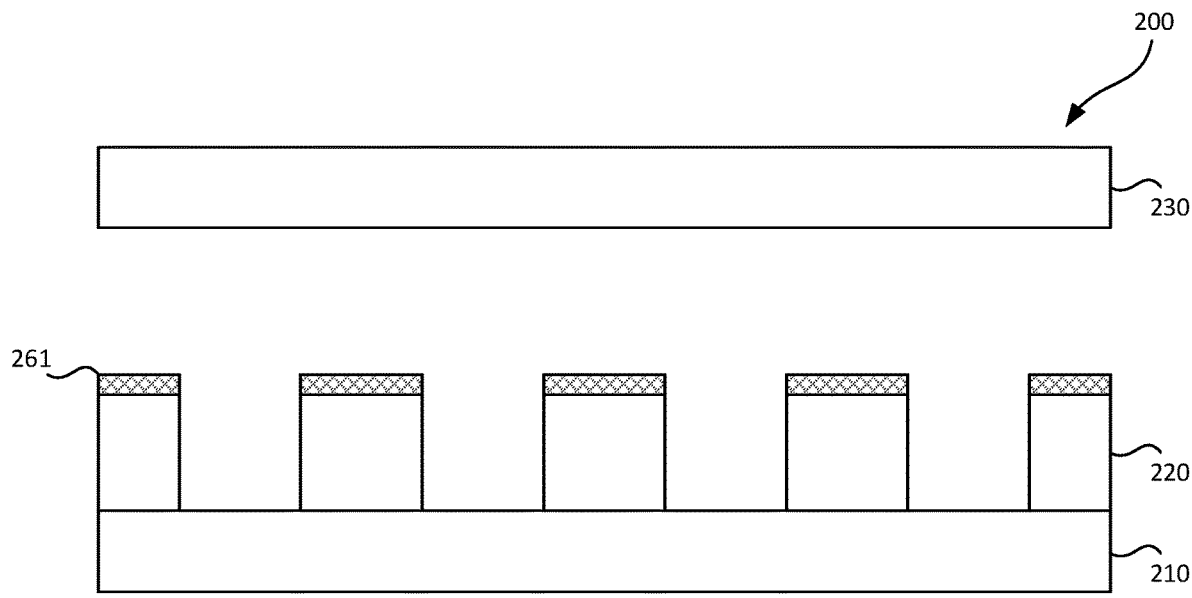

In non-limiting examples in which a solidified fluid is used to inhibit contact between the reagent and the sidewalls, the solidified fluid contained within the recesses may subsequently be melted. The melted fluid may then be removed from the recesses. For example, referring now to FIG. 2E and FIG. 6 (operation 660), solidified first fluid 241 may be then melted to re-form first fluid 240. In various examples, solidified first fluid 241 may be melted using a change in temperature. In examples where first fluid 240 is solidified by sufficiently reducing the temperature, solidified first fluid 241 may be melted by sufficiently increasing the temperature. For example, solidified first fluid 241 may include agarose, gelatin, one or more other polysaccharides, or one or more other low melting point polymers, where the agarose, gelatin, other polysaccharide(s), or other low melting point polymer(s) melts responsive to a sufficient increase in temperature. In examples where first fluid 240 is solidified by sufficiently increasing the temperature, solidified first fluid 241 may be melted by sufficiently reducing the temperature. For example, solidified first fluid 241 may include poly(N-isopropyl acrylamide), where the poly(N-isopropyl acrylamide melts responsive to a sufficient reduction in temperature. In various examples, solidified first fluid 241 may be melted using a change in pH. In examples where first fluid 240 is solidified by sufficiently increasing the pH level, solidified first fluid 241 may be melted by sufficiently reducing the pH level. For example, solidified first fluid 241 may include polyacrylic acid, where the polyacrylic acid melts responsive to a sufficient reduction in pH level. In examples where first fluid 240 is solidified using light, mechanical force, a reactive gas, an electrical field, a magnetic field, or a chemical, solidified first fluid 241 may be melted using light, mechanical force, a reactive gas, an electrical field, a magnetic field, or a chemical. For example, solidified first fluid 241 may include alginate, carboxycellulose, or gellan gum, where the alginate, carboxycellulose, or gellan melts in the presence of cation chelating agents. Or, for example, solidified first fluid 241 may include sodium polyacrylate, where the sodium polyacrylate melts in the presence of high salt media. Or, for example, solidified first fluid 241 may include one or more polyamines, polysaccharides, polypeptides, polyacrylates, polythiols, polysulfones, polyamides, or polyesters that are liquified responsive to suitable stimulus. Referring now to FIG. 2F and FIG. 6 (operation 670), first fluid 240 may be removed from recesses 224. For example, first fluid 240 may be removed using evaporation, heating, suction, or by other means.

Figure 7:
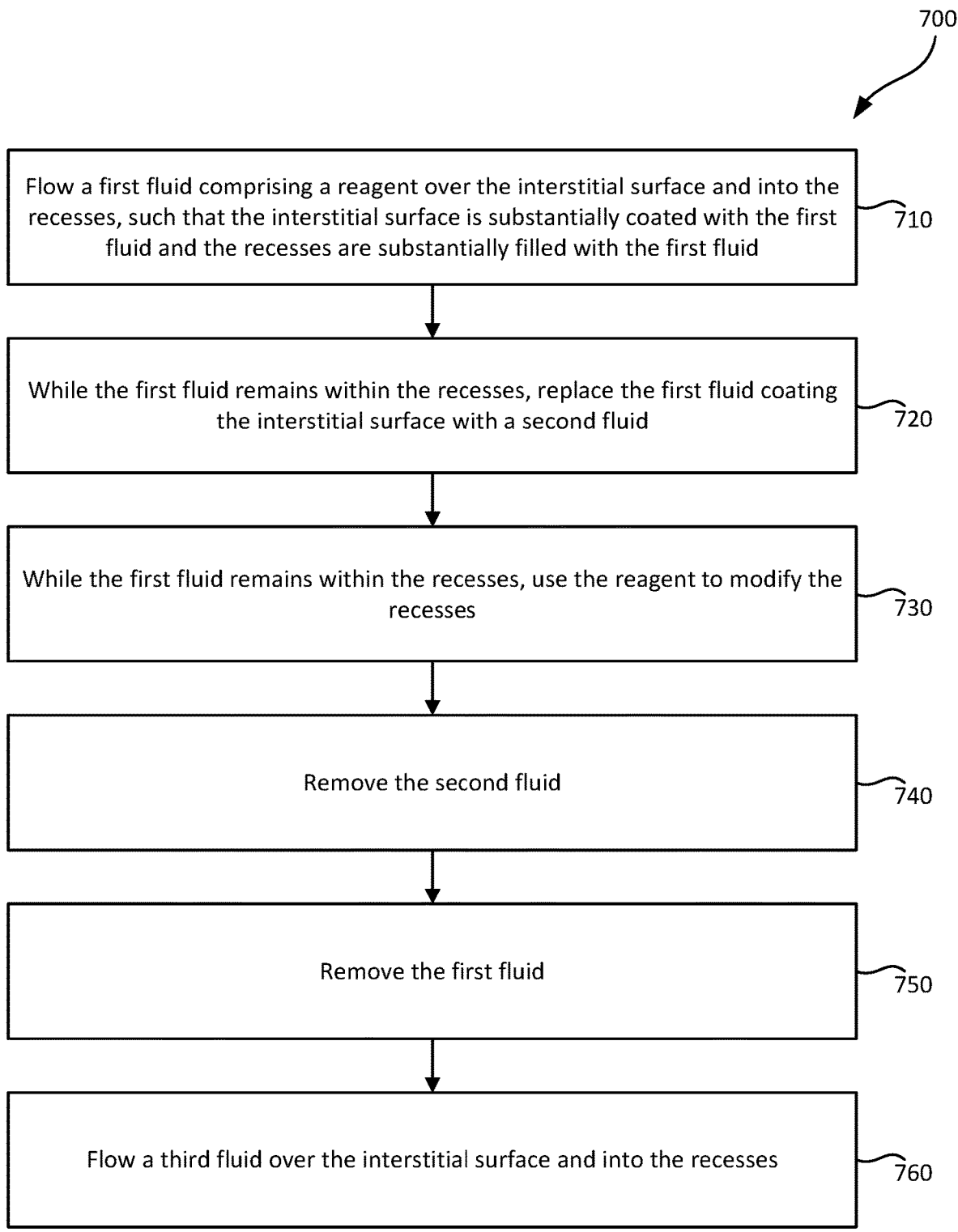
FIG. 7 illustrates a flow of operations in an example method for selectively modifying surfaces of recesses separated by an interstitial surface, in accordance with various examples.

A method for selectively modifying a surface may modify the inner surfaces of recesses instead of the interstitial surface. FIG. 7 illustrates a flow of operations in an example method for selectively modifying inner surfaces of recesses, in accordance with various examples. FIGS. 3A-3E illustrate example structures and operations for selectively modifying inner surfaces of recesses 324, in accordance with various examples. Optionally, operations illustrated in FIG. 7 may be used to create the structures described with reference to FIGS. 3A-3E.

Figure 3A:
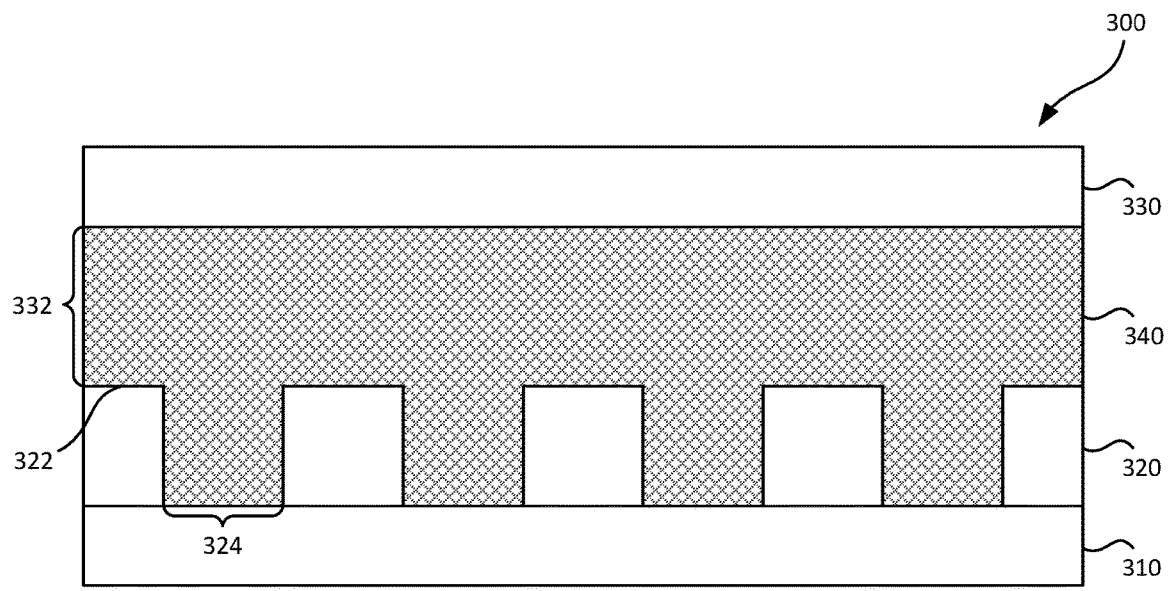
FIGS. 3A-3E illustrate example structures and operations for selectively modifying surfaces of recesses separated by an interstitial surface, in accordance with various examples.
Figure 3B:
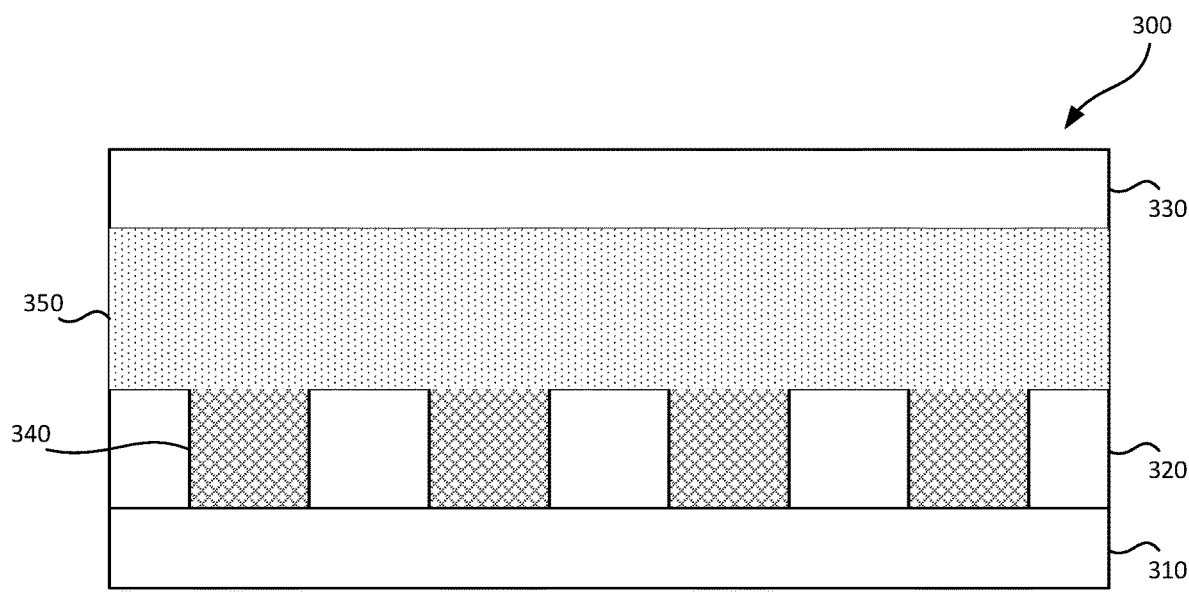
Figure 3C:
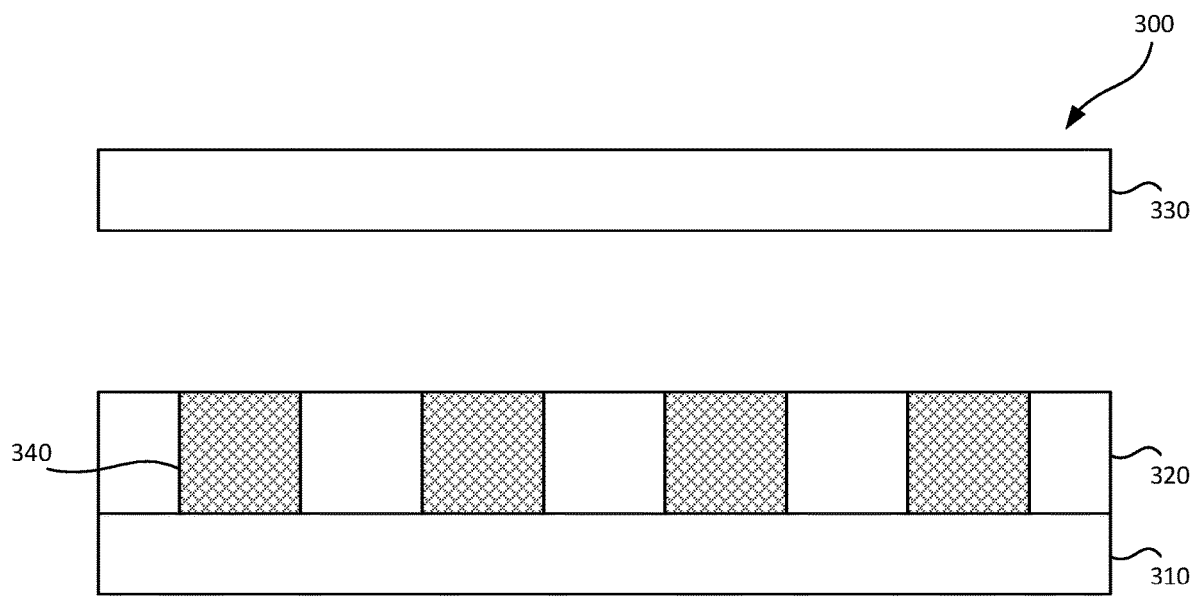

For example, with reference to FIG. 3A, structure 300 may include substrate 310 and patterned material 320. Patterned material 320 may include interstitial surface 322 and recesses 324. Patterned material 320 may form the sidewalls of recesses 324. Substrate 310 may form the bottom wall of recesses 324. In various examples, patterned material 320 may include a photoresist. In various examples, the photoresist includes SU-8. Substrate 310 may include any suitable material. Substrate 310 may include a material that is different than patterned material 320. In various examples, substrate 310 may include a glass, a semiconductor, or a polymer. In various examples, electrodes (not shown) may be disposed on substrate 310 within recesses 324. Structure 300 may optionally include cover 330. Cover 330 may be disposed over interstitial surface 322 and recesses 324. Cover 330 may form fluidic channel 332 between cover 330 and interstitial surface 322.

With additional reference to FIG. 7 (operation 710), in various examples, first fluid 340 may be flowed over interstitial surface 322 such that first fluid 340 substantially fills recesses 324. First fluid 340 may include a reagent. In various examples, the reagent may include a hydrogel, a biomolecule, streptavidin, DNA, a reagent for cleavage, or a reagent for capture. In various examples where cover 330 is present, first fluid 340 may be flowed into fluidic channel 332 using laminar flow. In operation, first fluid 340 flowing through fluidic channel 332 can be pressurized to any suitable level and may have any suitable temperature. A structure in accordance with various examples of this disclosure can be made in any suitable manner. In various examples, interstitial surface 322 and recesses 324 may be located within a flow cell. In various examples, recesses 324 may include a microwell. In such examples, recesses 324 may be filled with first fluid 340 using capillary action. A flow cell in accordance with various examples of this disclosure can be made in any suitable manner.

Figure 3D:
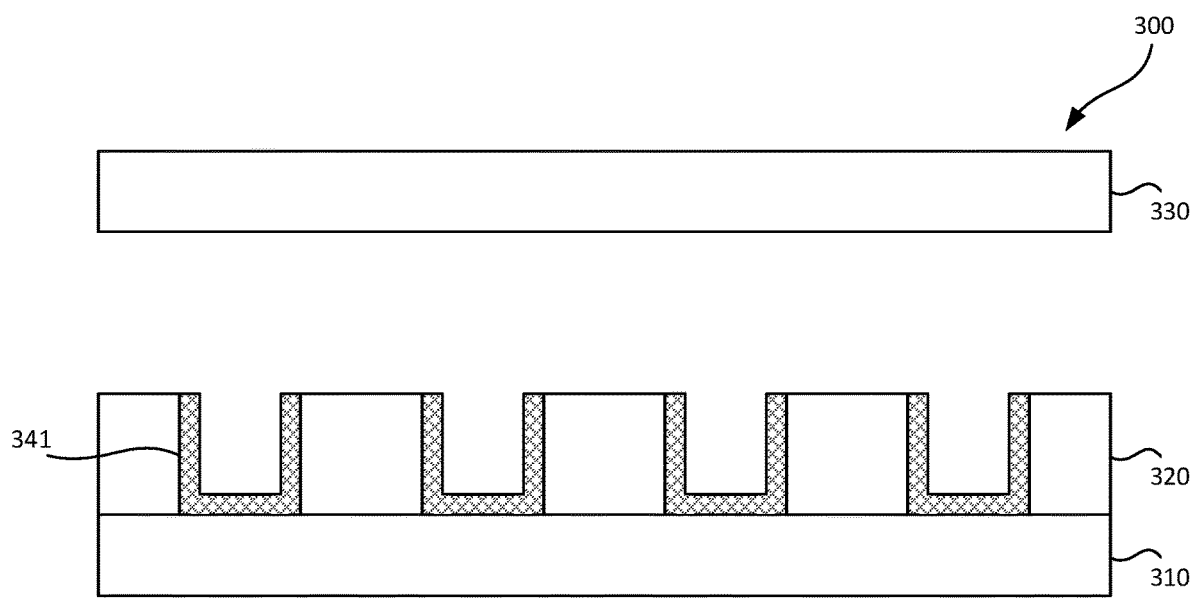
Figure 3E:
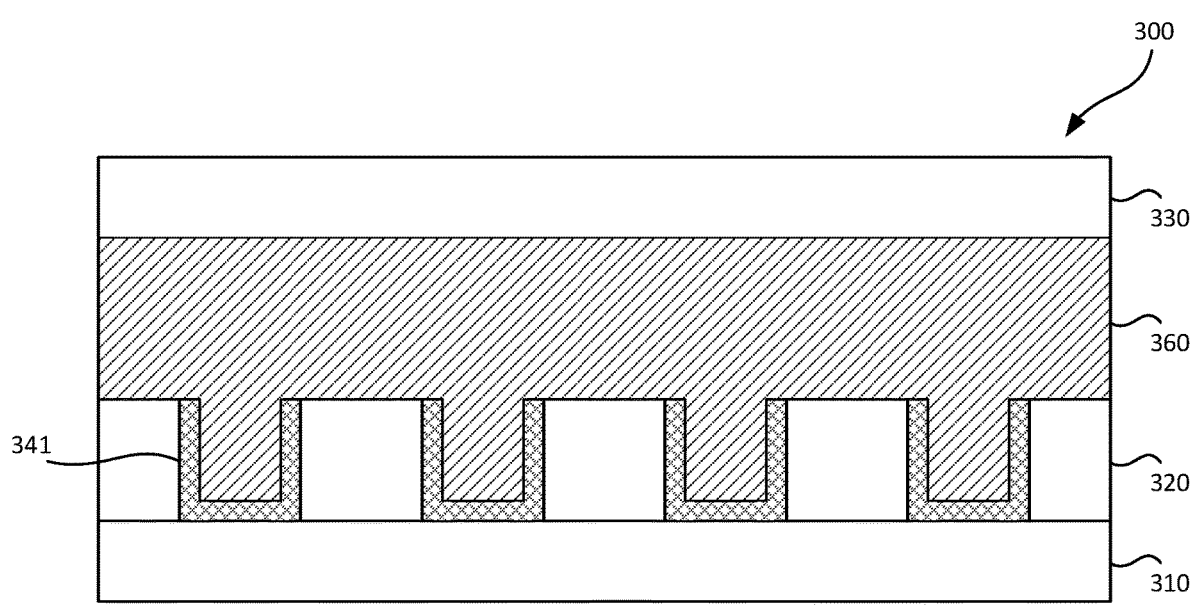

The fluid in contact with the interstitial surface may be displaced by another fluid. The fluid in contact contained with the recesses may then modify the recesses. The fluid in contact with the interstitial surface may then be removed. For example, referring now to FIG. 3B and FIG. 7 (operation 720), structure 300 may also include second fluid 350. Second fluid 350 may be flowed into structure 300 so as to displace first fluid 340 from interstitial surface 322, while leaving recesses 324 substantially filed by first fluid 340. In various examples where cover 330 is present, second fluid 350 may be flowed into fluidic channel 332 using laminar flow. In operation, second fluid 350 flowing through fluidic channel 332 can be pressurized to any suitable level and may have any suitable temperature. Second fluid 350 may substantially inhibit the reagent in first fluid 340 from modifying interstitial surface 322. For example, first fluid 340 and second fluid 350 may be substantially immiscible with each other. This property inhibits the reagent in first fluid 340 from flowing into second fluid 350. This property also allows second fluid 350 to inhibit the modification of interstitial surface 322 by first fluid 340 or the reagent. Any combination of immiscibility may be used, depending on the properties of substrate 310, patterned material 320, and the reagent. In various examples, first fluid 340 is polar and second fluid 350 is nonpolar. In various examples, first fluid 340 is aqueous and second fluid 350 is organic. In other various examples, first fluid 340 is nonpolar and second fluid 350 is polar. In various examples, first fluid 340 is organic and second fluid 350 is aqueous. It will be appreciated, however, that the first and second fluids may be in any suitable phase of matter, respectively. Referring now to FIG. 3D and FIG. 7 (operation 750), first fluid 340 may then be removed, leaving behind inner recess surface modifications 341. Inner recess surface modifications 341 may have the property that the contact angle of water with inner recess surface modifications 341 is between about 60 degrees and about 120 degrees, between about 70 degrees and about 110 degrees, between about 80 degrees and about 100 degrees, between about 85 degrees and about 95 degrees, or about 90 degrees.

For example, referring now to FIG. 7 (operation 730), first fluid 340 may then modify the inner surfaces of recesses 324. It may be that the reagent in first fluid 340 is what modifies the inner surfaces of recesses 324. In various examples, first fluid 340 may include a silane. In these examples, first fluid 340 may include one or more of (3-aminopropyl)triethoxysilane (APTES), 3-cyanopropyltrimethoxysilane (CPTMS), 3-(trimethoxysilyl)propyl acrylate (TRI), 3-azidopropyltriethoxysilane (Azido C3), n-propyltrimethoxysilane (C3), methoxytrimethylsilane (MDS), n-octyltrimethoxysilane (C8), (tridecafluoro-1,1,2,2-tetra-hydrooctyl)tri-methoxysilane (FOTMS), perfluoro(polypropyleneoxy)methoxypropyltri-methoxysilane (PPFTMS), or a mercapto-silane. In other examples, first fluid 340 may include a hydrogel precursor that forms a hydrogel (such as PAZAM) on the inner surfaces of recesses 324. The selectively functionalized recesses 324 then may be further processed to bind with biomolecules, such as DNA oligonucleotides to capture target DNA for sequencing.

FIG. 9 illustrates an example reaction between a fluid containing a silane and an SU-8 photoresist substrate, in accordance with various examples. With additional reference to FIG. 9, in various examples, where patterned surface 320 includes photoresist 910, APTES 920 (or other suitable fluid, which may be or include a silane in some examples) may react with residual epoxide groups 912 on the surface of photoresist 910. In various examples, photoresist 910 may include SU-8, including SU-8 commercially available from Kayaku Advanced Materials (Westborough, MA). For example, the amine group of APTES 920 may react with photoresist epoxide groups 912. Alternatively, a mercapto-silane may react with residual epoxide groups 912. The silane ethoxy groups 924 from APTES 920 or from the mercapto-silane may be hydrolyzed or condensed to form silanol groups. Interstitial surface modifications 151 may include silane ethoxy groups 924. The silanol groups may then be reacted with a silane, for example FOTMS 930, to form siloxane bond 932 and give the photoresist surface the desired property. In various examples, CPTMS, TRI, Azido C3, C3, MDS, C8, or PPFTMS may be reacted to the silanol groups instead of FOTMS 930. In various examples, CPTMS, TRI, Azido C3, C3, MDS, C8, or PPFTMS may be reacted to the silanol groups in addition to FOTMS 930. The identity of the selected silane(s) may influence the properties of the resulting modified photoresist surface. For example, selection of CPTMS, TRI, Azido C3, C3 MDS, C8, FOTMS, or PPFTMS may cause the resulting modified surface to have a contact angle with water of about 60 degrees to about 120 degrees, for example, of about 60 degrees, of about 70 degrees, of about 80 degrees, of about 90 degrees, of about 100 degrees, of about 110 degrees, or of about 120 degrees, respectively. The selected silane(s) may cause the resulting modified surface to have a contact angle with water of between about 60 degrees and about 120 degrees, between about 70 degrees and about 110 degrees, or between about 80 degrees and about 100 degrees. The reaction conditions with the selected silane(s) may vary with the identity of the selected silane.

The fluid contained within the recesses may then be removed from the structure. For example, first fluid 340 may be removed using evaporation, heating, suction, or by other means.

The structure optionally may be filled with another fluid. For example, referring now to FIG. 3E and FIG. 7 (operation 760), structure 300 may also include third fluid 360. Third fluid 360 may be flowed over interstitial surface 322. In various examples where cover 330 is present, third fluid 360 may be flowed into fluidic channel 332 using laminar flow. In operation, third fluid 360 flowing through fluidic channel 332 can be pressurized to any suitable level and may have any suitable temperature.

Figure 8:
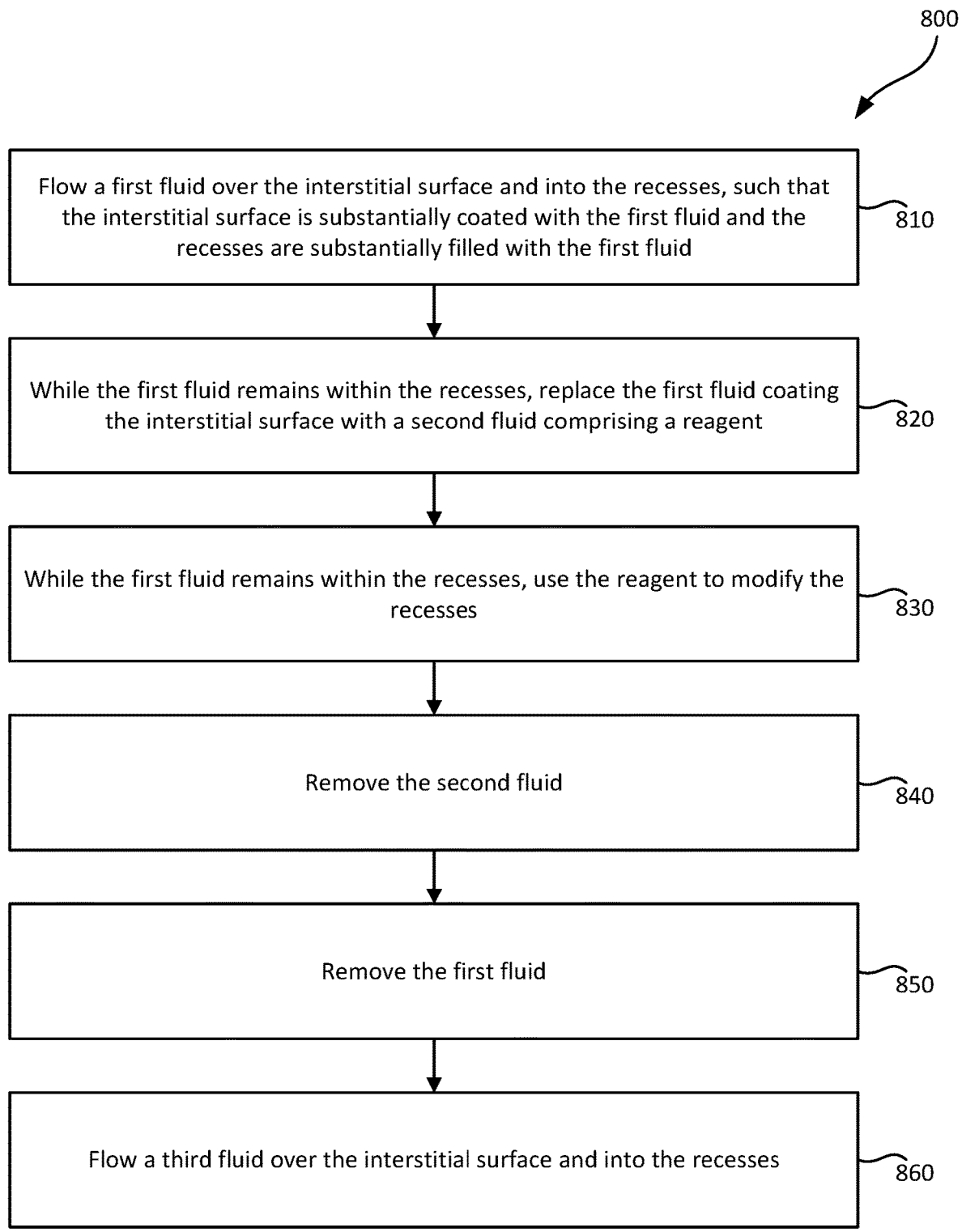
FIG. 8 illustrates a flow of operations in an example method for selectively modifying an interstitial surface, in accordance with various examples.

A method of selectively modifying an interstitial surface need not necessarily include the solidification of a fluid. FIG. 8 illustrates a flow of operations in an example method for selectively modifying an interstitial surface, in accordance with various examples. FIGS. 4A-4E illustrate example structures and operations for selectively modifying inner surfaces of recesses 424, in accordance with various examples. Optionally, operations illustrated in FIG. 8 may be used to create the structures described with reference to FIGS. 4A-4E.

Figure 4A:
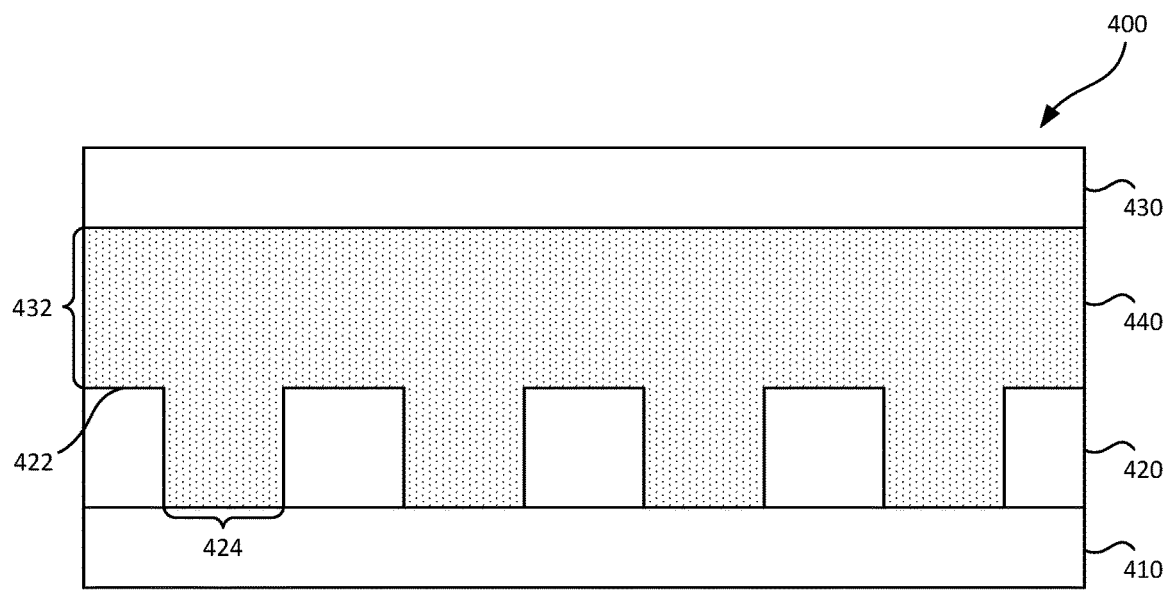
FIGS. 4A-4E illustrate example structures and operations for selectively modifying an interstitial surface, in accordance with various examples.
Figure 4B:
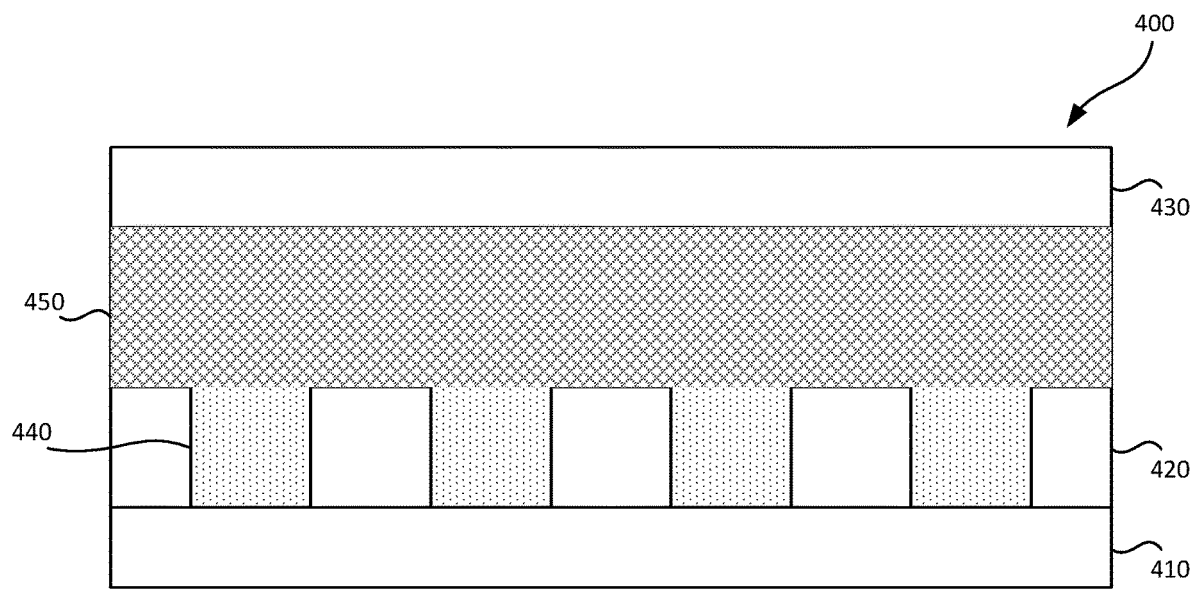
Figure 4C:
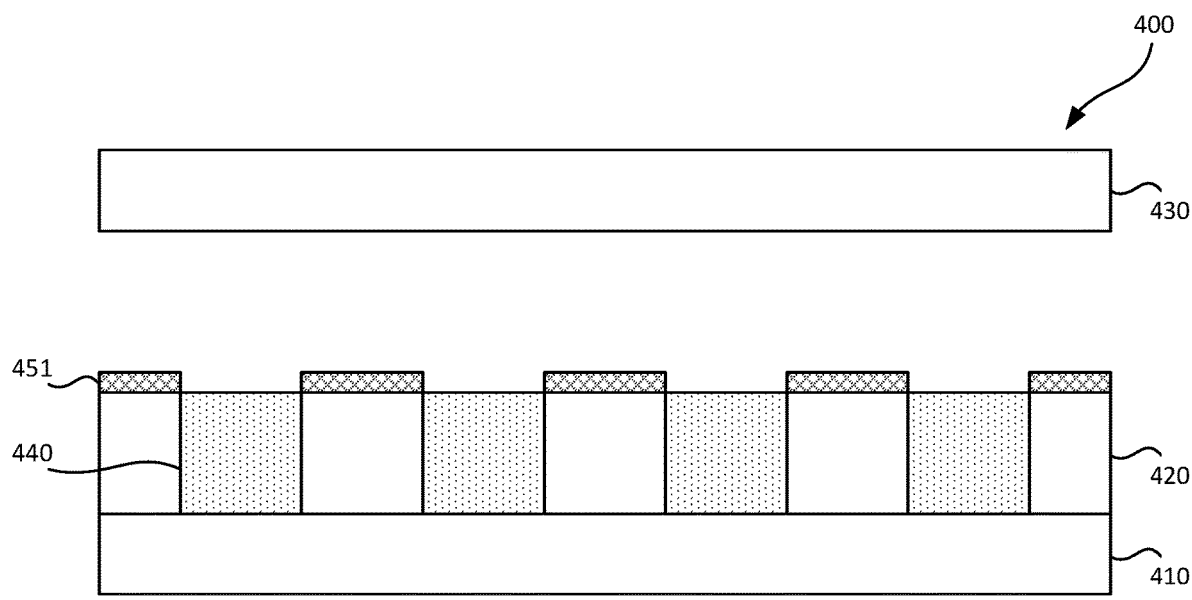
Figure 4D:
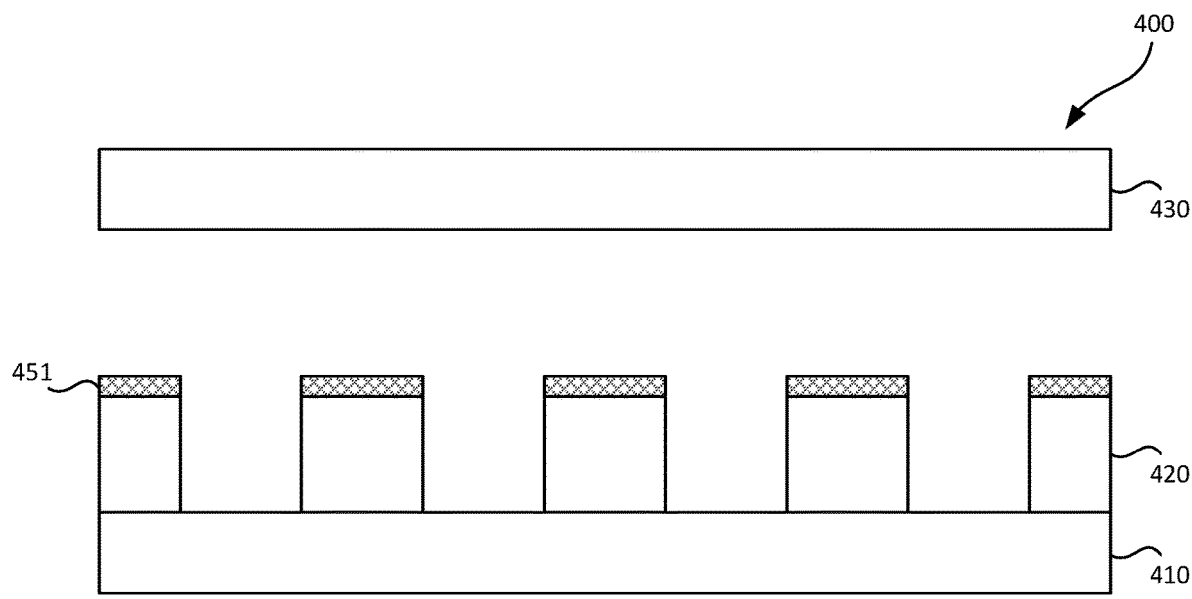
Figure 4E:
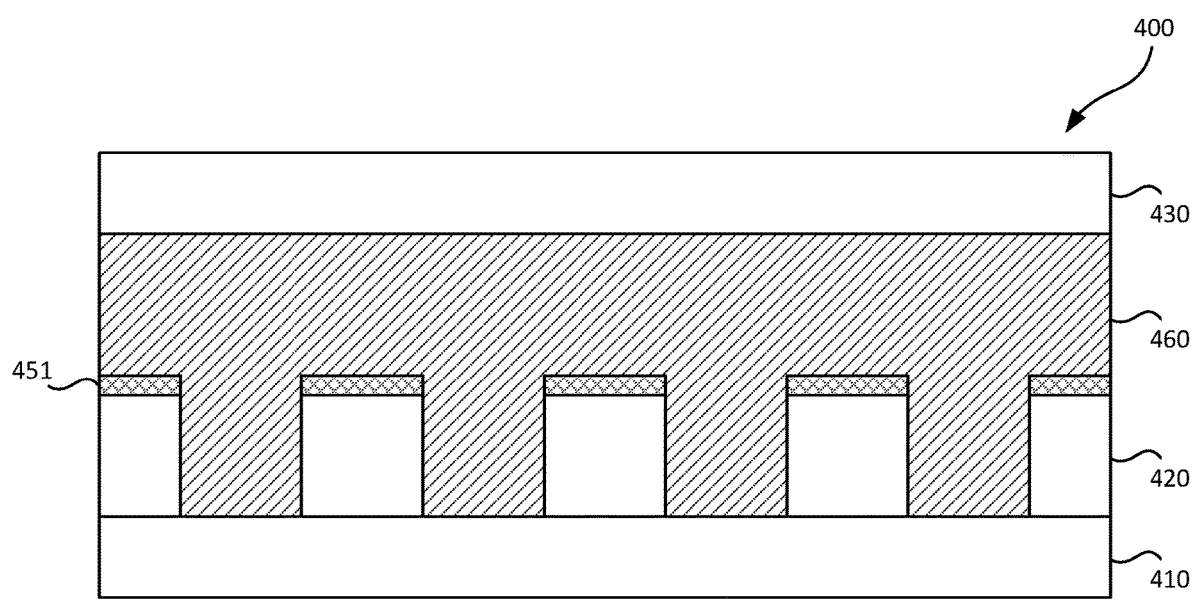

For example, with reference to FIG. 4A, structure 400 may include substrate 410 and patterned material 420. Patterned material 420 may include interstitial surface 422 and recesses 424. Patterned material 420 may form the sidewalls of recesses 424. Substrate 410 may form the bottom wall of recesses 424. In various examples, patterned material 420 may include a photoresist. In various examples, the photoresist includes SU-8. Substrate 410 may include any suitable material. Substrate 410 may include a material that is different than patterned material 420. In various examples, substrate 410 may include a glass, a semiconductor, or a polymer. In various examples, electrodes (not shown) may be disposed on substrate 410 within recesses 424. Structure 400 may optionally include cover 430. Cover 430 may be disposed over interstitial surface 422 and recesses 424. Cover 430 may form fluidic channel 432 between cover 430 and interstitial surface 422.

With additional reference to FIG. 8 (operation 810), in various examples, structure 400 may be filled with first fluid 440 such that first fluid 440 substantially fills recesses 424. In various examples where cover 430 is present, first fluid 440 may be flowed into fluidic channel 432 using laminar flow. In operation, first fluid 440 flowing through fluidic channel 432 can be pressurized to any suitable level and may have any suitable temperature. A structure in accordance with various examples of this disclosure can be made in any suitable manner. In various examples, interstitial surface 422 and recesses 424 may be located within a flow cell. In various examples, recesses 424 may include a microwell. In such examples, recesses 424 may be filled with first fluid 440 using capillary action. A flow cell in accordance with various examples of this disclosure can be made in any suitable manner.

The fluid in contact with the interstitial surface may be displaced by another fluid. The fluid in contact with the interstitial surface may then modify the interstitial surface. For example, referring now to FIG. 4B and FIG. 8 (operation 820), structure 400 may also include second fluid 450. Second fluid 450 may include a reagent. In various examples, the reagent may include a hydrogel, a biomolecule, streptavidin, DNA, a reagent for cleavage, or a reagent for capture. Second fluid 450 may be flowed over interstitial surface 422 so as to displace first fluid 440 from interstitial surface 422, while leaving recesses 424 substantially filed by second fluid 450. In various examples where cover 430 is present, second fluid 450 may be flowed into fluidic channel 432 using laminar flow. In operation, second fluid 450 flowing through fluidic channel 432 can be pressurized to any suitable level and may have any suitable temperature. First fluid 440 may substantially inhibit the reagent in second fluid 450 from modifying the inner surfaces of recesses 424. For example, second fluid 450 and first fluid 440 may be substantially immiscible with each other. This property inhibits the reagent in second fluid 450 from flowing into first fluid 440. This property also allows first fluid 440 to inhibit the modification of the inner surfaces of recesses 424 by second fluid 450 or the reagent. Any combination of immiscibility may be used, depending on the properties of substrate 410, patterned material 420, and the reagent. In various examples, second fluid 450 is polar and first fluid 440 is nonpolar. In various examples, second fluid 450 is aqueous and first fluid 440 is organic. In other various examples, second fluid 450 is nonpolar and first fluid 440 is polar. In various examples, second fluid 450 is organic and first fluid 440 is aqueous. For example, referring now and FIG. 8 (operation 850), first fluid 440 may then be removed, leaving behind interstitial surface modifications 451. Interstitial surface modifications 451 may have the property that the contact angle of water with interstitial surface modifications 451 is between about 60 degrees and about 120 degrees, between about 70 degrees and about 110 degrees, between about 80 degrees and about 100 degrees, between about 85 degrees and about 95 degrees, or about 90 degrees.

For example, referring now to FIG. 8 (operation 830), second fluid 450 may then modify interstitial surface 422. It may be that the reagent in second fluid 450 is what modifies interstitial surface 422. In various examples, second fluid 450 may include a silane. In these examples, second fluid 450 may include one or more of (3-aminopropyl)triethoxysilane (APTES), 3-cyanopropyl-trimethoxysilane (CPTMS), 3-(trimethoxysilyl)propyl acrylate (TRI), 3-azidopropyltriethoxysilane (Azido C3), n-propyltrimethoxysilane (C3), methoxytrimethylsilane (MDS), n-octyltrimethoxysilane (C8), (tridecafluoro-1,1,2,2-tetrahydrooctyl)tri-methoxysilane (FOTMS), perfluoro(polypropyleneoxy)methoxypropyltri-methoxysilane (PPFTMS), or a mercapto-silane.

FIG. 9 illustrates an example reaction between a fluid containing a silane and an SU-8 photoresist substrate, in accordance with various examples. Such reaction optionally may be used to functionalize an interstitial surface in a manner such as described with reference to FIGS. 1A-1F, 2A-2F, 4A-4E, 5, 6, or 8. Additionally, or alternatively, such reaction optionally may be used to functionalize a recess in a manner such as described with reference to FIGS. 3A-3E or 9. Referring now to FIG. 9, in various examples, where patterned surface 420 includes photoresist 910, APTES 920 (or other suitable fluid, which may be or include a silane in some examples) may react with residual epoxide groups 912 on the surface of photoresist 910. In various examples, photoresist 910 may include SU-8, including SU-8 commercially available from Kayaku Advanced Materials (Westborough, MA). For example, the amine group of APTES 920 may react with photoresist epoxide groups 912. Alternatively, a mercapto-silane may react with residual epoxide groups 912. The silane ethoxy groups 924 from APTES 920 or from the mercapto-silane may be hydrolyzed or condensed to form silanol groups. Interstitial surface modifications 151 may include silane ethoxy groups 924. The silanol groups may then be reacted with a silane, for example FOTMS 930, to form siloxane bond 932 and give the photoresist surface the desired property. In various examples, CPTMS, TRI, Azido C3, C3, MDS, C8, or PPFTMS may be reacted to the silanol groups instead of FOTMS 930. In various examples, CPTMS, TRI, Azido C3, C3, MDS, C8, or PPFTMS may be reacted to the silanol groups in addition to FOTMS 930. The identity of the selected silane(s) may influence the properties of the resulting modified photoresist surface. For example, selection of CPTMS, TRI, Azido C3, C3 MDS, C8, FOTMS, or PPFTMS may cause the resulting modified surface to have a contact angle with water of about 60 degrees to about 120 degrees, for example, of about 60 degrees, of about 70 degrees, of about 80 degrees, of about 90 degrees, of about 100 degrees, of about 110 degrees, or of about 120 degrees, respectively. The selected silane(s) may cause the resulting modified surface to have a contact angle with water of between about 60 degrees and about 120 degrees, between about 70 degrees and about 110 degrees, or between about 80 degrees and about 100 degrees. The reaction conditions with the selected silane(s) may vary with the identity of the selected silane.

The structure optionally may be filled with another fluid. For example, referring now to FIG. 4E and FIG. 8 (operation 860), structure 400 may also include third fluid 460. Third fluid 460 may be flowed over interstitial surface 422. In various examples where cover 430 is present, third fluid 460 may be flowed into fluidic channel 432 using laminar flow. In operation, third fluid 460 flowing through fluidic channel 432 can be pressurized to any suitable level and may have any suitable temperature.

A flow cell in accordance with various examples of this disclosure can be made in any suitable manner.

Referring now to FIGS. 1F, 2F, 3E, and 4E, interstitial surface modifications 151, 261, or inner recess surface modifications 341, 451 optionally may include oligonucleotides, e.g., capture primers having orthogonal sequences. Fluidic channel 132, 232, 332, 432, may be used to carry fluid(s) across any oligonucleotides that may be included in interstitial surface modifications 151, 261, or inner recess surface modifications 341, 451. Such fluid(s) may, for example, include a target polynucleotide to be amplified using said oligonucleotides and a polymerase and nucleotides for use during such amplification.

WORKING EXAMPLES

The following examples are intended to be purely illustrative, and not limiting of the present subject matter.

Example 1

In an example consistent with FIGS. 1A-1F, water was used as first fluid 140, and silicone oil was used as second fluid 150 to remove the water from interstitial surfaces 122 which included an epoxy resist having a water contact angle of about 85 degrees. For the particular combination of materials used in this nonlimiting example, a silicone oil flow rate of about 0.1 µL/second was found to sufficiently remove the water from interstitial surfaces 122.

Example 2

In another example consistent with FIGS. 1A-1F, interstitial surfaces 122 were silanized. More specifically, recesses 124 formed in an epoxy resist were wetted using isopropyl alcohol (IPA). The recesses 124 then were filled with water as the first fluid 140. Tetradecafluorohexane was then used to remove the water from interstitial surfaces 122. The silane PPFTMS dissolved in tetradecafluorohexane, as the second fluid 150, was flowed over interstitial surfaces 122 and incubated to silanize the interstitial surfaces 122. The unreacted silane was then removed using additional tetradecafluorohexane. The structure of PPFTMS is shown below:

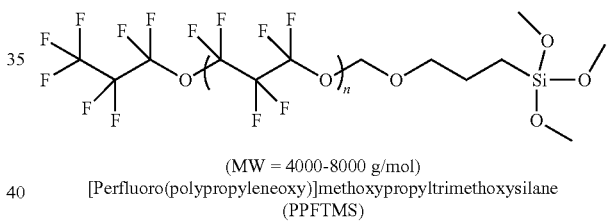

(MW = 4000-8000 g/mol)
[Perfluoro(polypropyleneoxy)]methoxypropyltrimethoxysilane
(PPFTMS)

Example 3

In another example consistent with FIGS. 1A-1F, interstitial surfaces 122 were silanized. More specifically, recesses 124 formed in an epoxy resist were filled with air as the first fluid 140. Water was then used to remove the air from interstitial surfaces 122, forming bubbles of air within recesses 124. The silane APTES dissolved in water, as the second fluid 150, was flowed over interstitial surfaces 122 and incubated to silanize the interstitial surfaces 122. The unreacted silane was then removed using additional water.

Example 4

In another example consistent with FIGS. 1A-1F, interstitial surfaces 122 were silanized. More specifically, recesses 124 formed in an epoxy resist were wetted using isopropyl alcohol (IPA). The recesses then were filled with agarose in a hot liquid state, as the first fluid 140. While the agarose was still hot and in the liquid phase, octane was used to remove the agarose from interstitial surfaces 122. The agarose was then cooled and solidified within recesses 124. Cover 130 was then removed, and the interstitial surfaces 122 were silanized by exposing the surfaces to the vapor-phase silane FOTMS in a heated, sealed vacuum chamber for several hours. The unreacted silane was then removed by washing with water, ethanol, and isopropyl alcohol. The agarose was melted and washed with warm water to remove the agarose from recesses 124.

Example 5

In another example consistent with FIGS. 1A-1F, interstitial surfaces 122 were silanized. More specifically, recesses 124 formed in an epoxy resist were filled with octane as the first fluid 140. Water was then used to remove the octane from interstitial surfaces 122. The silane APTES dissolved in water, as the second fluid 150, was flowed over interstitial surfaces 122 and incubated to silanize the interstitial surfaces 122. The unreacted silane was then removed using additional water. Optionally, a second silane may be added to the octane to allow a different silanization reaction inside of recesses 124.

From these examples, it may be understood that a wide variety of fluids, including a wide variety of states of matter (e.g., solid, liquid, and/or gaseous) may be used as the first and second fluids 140, 150.

Additional Comments

It is to be understood that any respective features/examples of each of the aspects of the disclosure as described herein can be implemented together in any appropriate combination, and that any features/examples from any one or more of these aspects can be implemented together with any of the features of the other aspect(s) as described herein in any appropriate combination to achieve the benefits as described herein.

While various illustrative examples are described above, it will be apparent to one skilled in the art that various changes and modifications can be made therein without departing from the invention. The appended claims are intended to cover all such changes and modifications that fall within the true spirit and scope of the invention.

What is claimed is:

1. A method for modifying an interstitial surface separating recesses from one another, the method comprising:
   flowing a first fluid over the interstitial surface and into the recesses, such that the interstitial surface is substantially coated with the first fluid and the recesses are substantially filled with the first fluid;
   while the first fluid remains within the recesses, replacing the first fluid coating the interstitial surface with a second fluid comprising a reagent; and
   while the first fluid remains within the recesses and after replacing the first fluid coating the interstitial surface with the second fluid, solidifying the first fluid.

2. The method of claim 1, further comprising using the reagent to modify the interstitial surface.

3. The method of claim 1, wherein the first fluid remaining within the recesses substantially inhibits the reagent from modifying the recesses.

4. The method of claim 1, wherein the first fluid and the second fluid are substantially immiscible with each other.

5. The method of claim 1, wherein the first fluid is polar and the second fluid is nonpolar, or wherein the first fluid is nonpolar and the second fluid is polar.

6. The method of claim 1, wherein the second fluid displaces the first fluid from the interstitial surface.

7. The method of claim 1, wherein a third fluid displaces the first fluid from the interstitial surface before the second fluid replaces the first fluid coating the interstitial surface.

8. The method of claim 7, wherein the third fluid is substantially immiscible with the second fluid.

9. The method of claim 7, wherein the third fluid is miscible with the first fluid.

10. The method of claim 7, wherein the second fluid displaces the third fluid from the interstitial surface.

11. The method of claim 1, wherein the first fluid is solidified using a change in temperature, a change in pH, light, mechanical force, a reactive gas, an electrical field, a magnetic field, or a chemical.

12. The method of claim 1, further comprising, after solidifying the first fluid within the recesses:
    melting the solidified first fluid; and
    removing the melted first fluid from the recesses.

13. The method of claim 1, wherein the second fluid comprises a gas.

14. The method of claim 1, wherein a cover is disposed over the interstitial surface and the recesses, forming a space between the cover and the interstitial surface.

15. The method of claim 14, comprising using laminar flow to flow the first and second fluids in the space between the cover and the interstitial surface.

16. The method of claim 1, wherein the first fluid and the second fluid both comprise liquids.

17. The method of claim 1, wherein one of the first fluid and the second fluid is a liquid, and the other of the first fluid and the second fluid is a gas.

18. A method for modifying recesses that are separated from one another by an interstitial surface, the method comprising:
    flowing a first fluid comprising a reagent over the interstitial surface and into the recesses, such that the interstitial surface is substantially coated with the first fluid and the recesses are substantially filled with the first fluid;
    while the first fluid remains within the recesses, replacing the first fluid coating the interstitial surface with a second fluid;
    wherein one of the first fluid and the second fluid is a liquid, and the other of the first fluid and the second fluid is a gas.

* * * * *